United States Patent
Lee et al.

(10) Patent No.: US 10,348,262 B2
(45) Date of Patent: Jul. 9, 2019

(54) MULTI-INPUT AMPLIFIER WITH PROGRAMMABLE EMBEDDED ATTENUATORS

(71) Applicant: SKYWORKS SOLUTIONS, INC., Woburn, MA (US)

(72) Inventors: Junhyung Lee, Irvine, CA (US); Rimal Deep Singh, Irvine, CA (US); Johannes Jacobus Emile Maria Hageraats, Kamuela, HI (US); Joshua Haeseok Cho, Irvine, CA (US); Bipul Agarwal, Irvine, CA (US); Aravind Kumar Padyana, Costa Mesa, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/690,762

(22) Filed: Aug. 30, 2017

(65) Prior Publication Data
US 2018/0062600 A1  Mar. 1, 2018

Related U.S. Application Data

(60) Provisional application No. 62/381,262, filed on Aug. 30, 2016.

(51) Int. Cl.
*H03G 3/30* (2006.01)
*H03F 1/56* (2006.01)
(Continued)

(52) U.S. Cl.
CPC .......... *H03G 3/3042* (2013.01); *H03F 1/223* (2013.01); *H03F 1/56* (2013.01); *H03F 3/193* (2013.01);
(Continued)

(58) Field of Classification Search
CPC .. H03G 3/3042; H03G 1/0029; H03G 1/0088; H03G 3/001; H03G 3/3063;
(Continued)

(56) References Cited

U.S. PATENT DOCUMENTS

| 6,133,791 A | 10/2000 | Horiguchi et al. |
| 2012/0206205 A1* | 8/2012 | Hoogzaad ............... H03F 1/22 330/284 |

(Continued)

OTHER PUBLICATIONS

International Search Report, PCT/US2017/049324, dated Dec. 11, 2017.
Written Opinion, PCT/US2017/049324, dated Dec. 11, 2017.

*Primary Examiner* — Eugene Yun
(74) *Attorney, Agent, or Firm* — Chang & Hale LLP

(57) ABSTRACT

Described herein are variable gain amplifiers and multiplexers that embed programmable attenuators into switchable paths that allow signals in a high gain mode to bypass attenuation. This advantageously reduces or eliminates performance penalties in the high gain mode. The programmable attenuators can be configured to improve linearity of the amplification process through pre-LNA attenuation in targeted gain modes. In addition, described herein are variable gain amplifiers with embedded attenuators in a switching network. The attenuators can be embedded onto switches and can be configured to have little or no effect on a noise factor in a high gain mode because the switching network can provide an attenuation bypass in a high gain mode and an attenuation in other gain modes. The programmable attenuators can be embedded onto a multi-input LNA architecture.

20 Claims, 12 Drawing Sheets

(51) Int. Cl.
*H03F 3/193* (2006.01)
*H04B 7/08* (2006.01)
*H03F 1/22* (2006.01)
*H03G 1/00* (2006.01)
*H03G 3/00* (2006.01)

(52) U.S. Cl.
CPC ......... *H03G 1/0029* (2013.01); *H03G 1/0088* (2013.01); *H03G 3/001* (2013.01); *H03G 3/3063* (2013.01); *H04B 7/08* (2013.01); *H03F 2200/211* (2013.01); *H03F 2200/222* (2013.01); *H03F 2200/387* (2013.01); *H03F 2200/451* (2013.01); *H03G 2201/106* (2013.01)

(58) Field of Classification Search
CPC ..... H03G 2201/106; H03F 1/223; H03F 1/56; H03F 3/193; H03F 2200/211; H03F 2200/451; H03F 2200/387; H03F 2200/222; H04B 7/08
USPC .......................................................... 455/73
See application file for complete search history.

(56) References Cited

U.S. PATENT DOCUMENTS

| | | |
|---|---|---|
| 2013/0027138 A1 | 1/2013 | Destouches et al. |
| 2013/0072137 A1 | 3/2013 | Carney et al. |
| 2014/0203872 A1 | 7/2014 | Sjoland |
| 2016/0077158 A1* | 3/2016 | Yamashita ............. G01R 35/00 702/123 |
| 2016/0248400 A1* | 8/2016 | Walker .............. H04W 72/0406 |

* cited by examiner

MULTI-INPUT AMPLIFIER WITH PROGRAMMABLE EMBEDDED ATTENUATORS

CROSS-REFERENCE TO RELATED APPLICATIONS

This application claims priority to U.S. Provisional Application No. 62/381,262 filed Aug. 30, 2016 and entitled "MULTI-INPUT AMPLIFIER WITH PROGRAMMABLE EMBEDDED ATTENUATORS," which is expressly incorporated by reference herein in its entirety for all purposes.

BACKGROUND

Field

The present disclosure generally relates to amplifiers for wireless communication devices.

Description of Related Art

In electronic applications, such as radio-frequency (RF) applications, it is sometimes desirable to amplify or attenuate a signal. For example, a to-be-transmitted signal can be amplified by a power amplifier, and a received signal can be amplified by a low-noise amplifier. In another example, one or more attenuators can be implemented along either or both of the foregoing transmit and receive paths as needed or desired to attenuate the respective signal(s).

SUMMARY

According to a number of implementations, the present disclosure relates to a variable-gain signal amplifier that includes a first attenuation stage having a plurality of branches, each branch including a switch and a variable-attenuation element, the first attenuation stage having a common output and an input for each branch. The amplifier also includes an amplification stage coupled to the common output of the first attenuation stage to provide a multiplexed output. The amplifier also includes a second attenuation stage configured to receive the multiplexed output of the amplification stage to provide an amplified output signal to maintain various desired characteristics across a range of gain levels.

In some embodiments, the signal includes a radio frequency signal. In some embodiments, the first attenuation stage is configured to provide a bypass path so that a signal received at an input is directed to the common output without being attenuated by the variable-attenuation element. In further embodiments, the first attenuation stage is configured to provide the bypass path in a high gain mode. In yet further embodiments, in the high gain mode, a noise factor of a signal is not increased due at least in part to bypassing the variable-attenuation element. In further embodiments, in other gain modes, IIP3 of the signal is increased due at least in part to tailored attenuation provided by the variable-attenuation element.

In some embodiments, the amplifier is configured to receive signals at respective inputs that cover a plurality of cellular frequency bands. In some embodiments, the amplifier is configured to attenuate or amplify a signal received at a particular input independent of attenuation or amplification of other signals received at other inputs.

In some embodiments, the amplifier further includes a control circuit configured to send control signals to the first attenuation stage, the amplification stage, or the second attenuation stage. In further embodiments, the control circuit includes a controller configured to provide an amplification control signal in a high gain mode that causes the first attenuation stage to provide a path that bypasses the variable-attenuation element.

According to a number of implementations, the present disclosure relates to a variable-gain amplifier includes a switching stage having a plurality of branches, each branch including a switch and an embedded programmable attenuation element, the first switching stage having a common output and an input for each branch. The amplifier also includes an amplification stage coupled to the common output of the switching stage to provide a multiplexed output. The amplifier also includes a post-amplification attenuation stage configured to receive the multiplexed output of the amplification stage, the post-amplification attenuation stage configured to provide an attenuation path through an embedded programmable attenuator and a bypass path, the paths configured to maintain various desired characteristics across a range of gain levels. The amplifier also includes a splitter configured to receive a single input and to provide a plurality of outputs.

In some embodiments, the first switching stage is configured to selectively direct targeted signals to the amplification stage. In some embodiments, for individual branches of the plurality of branches, the switching stage is configured to provide an attenuation path that passes through the embedded programmable attenuation element and a bypass path that does not pass through the embedded programmable attenuation element. In further embodiments, in a high gain mode, the switching stage is configured to direct signals along the bypass path. In yet further embodiments, in the high gain mode, signals directed along the bypass path maintain substantially the same value of a noise factor before and after the switching stage. In further embodiments, in other gain modes, signals directed along attenuation paths improve linearity due at least in part to tailored attenuations provided by the embedded programmable attenuation elements.

In some embodiments, the amplifier further includes a control circuit configured to send control signals to the switching stage, the amplification stage, the post-amplification attenuation stage, or the splitter. In further embodiments, the control circuit includes a controller configured to provide an amplification control signal in a high gain mode that causes the switching stage to provide a path that bypasses the variable-attenuation element.

According to a number of implementations, the present disclosure relates to a front end architecture that includes a variable gain signal amplifier including a first attenuation stage having a plurality of branches, each branch including a switch and a variable-attenuation element, the first attenuation stage having a common output and an input for each branch; an amplification stage coupled to the common output of the first attenuation stage to provide a multiplexed output; and a second attenuation stage configured to receive the multiplexed output of the amplification stage to provide an amplified output signal to maintain various desired characteristics across a range of gain levels. The front end architecture also includes a filter assembly coupled to the variable gain signal amplifier to direct frequency bands to select inputs of the variable gain signal amplifier. The front end architecture also includes a controller implemented to control the variable gain signal amplifier to provide a plurality of gain modes such that, in a high gain mode, the variable gain signal amplifier directs signals along a path that bypasses the variable-attenuation element in a particular branch.

In some embodiments, in the high gain mode, a noise factor of a signal is not increased due at least in part to bypassing the variable-attenuation element. In further embodiments, in other gain modes, IIP3 of the signal is increased due at least in part to tailored attenuation provided by the variable-attenuation element.

According to a number of implementations, the present disclosure relates to a wireless device that includes a diversity antenna and a filter assembly coupled to the diversity antenna to receive signals and to direct frequency bands along select paths. The wireless device also includes a variable gain signal amplifier coupled to the filter assembly to receive signals from select paths, the variable gain signal amplifier including a first attenuation stage having a plurality of branches, each branch including a switch and a variable-attenuation element, the first attenuation stage having a common output and an input for each branch; an amplification stage coupled to the common output of the first attenuation stage to provide a multiplexed output; and a second attenuation stage configured to receive the multiplexed output of the amplification stage to provide an amplified output signal to maintain various desired characteristics across a range of gain levels. The wireless device also includes a controller implemented to control the variable gain signal amplifier to provide a plurality of gain modes such that, in a high gain mode, the variable gain signal amplifier directs signals along a path that bypasses the variable-attenuation element in a particular branch.

In some embodiments, in the high gain mode, a noise factor of a signal is not increased due at least in part to bypassing the variable-attenuation element. In further embodiments, in other gain modes, IIP3 of the signal is increased due at least in part to tailored attenuation provided by the variable-attenuation element.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Overview

Figure 1:
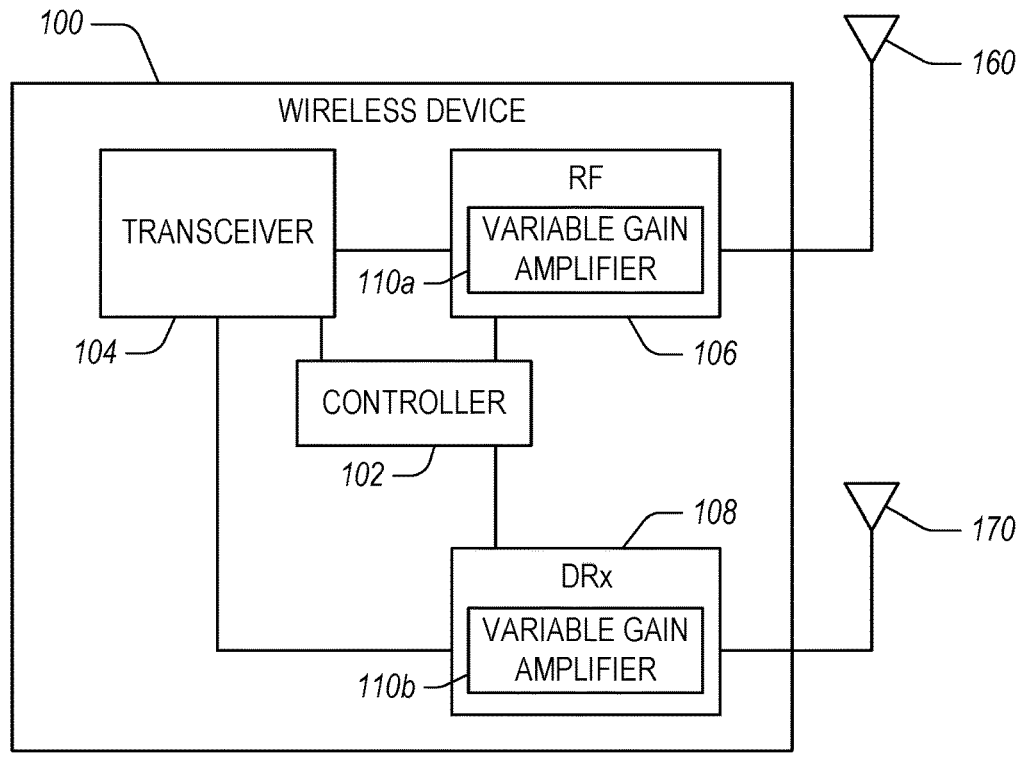
FIG. 1 illustrates a wireless device having a primary antenna and a diversity antenna.

FIG. 1 illustrates a wireless device 100 having a primary antenna 160 and a diversity antenna 170. The wireless device 100 includes an RF module 106 and a transceiver 104 that may be controlled by a controller 102. The transceiver 104 is configured to convert between analog signals (e.g., radio-frequency (RF) signals) and digital data signals. To that end, the transceiver 104 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The RF module 106 is coupled between the primary antenna 160 and the transceiver 104. Because the RF module 106 may be physically close to the primary antenna 160 to reduce attenuation due to cable loss, the RF module 106 may be referred to as front-end module (FEM). The RF module 106 may perform processing on an analog signal received from the primary antenna 160 for the transceiver 104 or received from the transceiver 104 for transmission via the primary antenna 160. To that end, the RF module 106 may include filters, power amplifiers, low noise amplifiers, band select switches, attenuators, matching circuits, and other components.

When a signal is transmitted to the wireless device 100, the signal may be received at both the primary antenna 160 and the diversity antenna 170. The primary antenna 160 and diversity antenna 170 may be physically spaced apart such that the signal at the primary antenna 160 and diversity antenna 170 is received with different characteristics. For example, in one embodiment, the primary antenna 160 and the diversity antenna 170 may receive the signal with different attenuation, noise, frequency response, and/or phase shift. The transceiver 104 may use both of the signals with different characteristics to determine data bits corresponding to the signal. In some implementations, the transceiver 104 selects from between the primary antenna 160 and the diversity antenna 170 based on the characteristics, such as selecting the antenna with the highest signal-to-noise ratio. In some implementations, the transceiver 104 combines the signals from the primary antenna 160 and the diversity antenna 170 to increase the signal-to-noise ratio of the combined signal. In some implementations, the transceiver 104 processes the signals to perform multiple-input/multiple-output (MiMo) communication.

In some embodiments, the diversity antenna 170 is configured to receive signals within cellular frequency bands and wireless local area network (WLAN) frequency bands. In such embodiments, the wireless device 100 can include a multiplexer, switching network, and/or filter assembly coupled to the diversity antenna 170 that is configured to separate the diversity signal into different frequency ranges. For example, the multiplexer can be configured to include a low pass filter that passes a frequency range that includes low band cellular frequencies, a bandpass filter that passes a frequency range that includes low band WLAN signals and mid-band and high-band cellular signals, and a high pass filter that passes a frequency range that includes high-band WLAN signals. This example is merely for illustrative purpose. As another example, the multiplexer can have a variety of different configurations such as a diplexer that provides the functionality of a high pass filter and a low pass filter.

Because the diversity antenna 170 is physically spaced apart from the primary antenna 160, the diversity antenna 170 can be coupled to the transceiver 104 by a transmission line, such as a cable or a printed circuit board (PCB) trace. In some implementations, the transmission line is lossy and attenuates the signal received at the diversity antenna 170 before it reaches the transceiver 104. Thus, in some implementations, gain is applied to the signal received at the diversity antenna 170. The gain (and other analog processing, such as filtering) may be applied by the diversity receiver module 108. Because such a diversity receiver module 108 may be located physically close to the diversity antenna 170, it may be referred to a diversity receiver front-end module, examples of which are described in greater detail herein.

The RF module 106 and the diversity receiver module 108 include variable gain amplifiers 110a, 110b configured to selectively attenuate and amplify signals from the primary antenna 160 and the diversity antenna 170, respectively. Each variable gain amplifier 110a, 110b can include a programmable attenuation stage before and after an amplification stage. Signals received at the variable gain amplifiers 110a, 110b can be attenuated by the pre-amplification attenuation stage or the signals can be allowed to bypass attenuation, as described in greater detail herein. The selected attenuation, or the provided bypass path, can be controlled by the controller 102. The variable, programmable attenuation can be embedded on the variable gain amplifier 110a, 110b. The variable gain amplifier 110a, 110b can receive multiple input signals and output a single signal or a plurality of output signals. Advantageously, the architecture of the variable gain amplifier 110a, 110b can allow a single amplifier, such as a low-noise amplifier (LNA), to be used to process signals covering a plurality of cellular frequency bands.

The controller 102 can be configured to generate and/or send control signals to other components of the wireless device 100. In some embodiments, the controller 102 provides signals based at least in part on specifications provided by the mobile industry processor interface alliance (MIPI® Alliance). The controller 102 can be configured to receive signals from other components of the wireless device 100 to process to determine control signals to receive to other components. In some embodiments, the controller 102 can be configured to analyze signals or data to determine control signals to send to other components of the wireless device 100. The controller 102 can be configured to generate control signals based on gain modes provided by the wireless device 100. For example, the controller 102 can send control signals to the variable gain amplifiers 110a, 110b to control attenuation and amplification provided by the amplifiers. Similarly, the controller 102 can be configured to generate control signals based on programmed attenuations. For example, the controller 102 can send control signals to pre- and post-amplification attenuation stages to control the amount of attenuation provided at those stages.

In some implementations, the controller 102 generates amplifier control signal(s) based on a quality of service metric of an input signal received at the input. In some implementations, the controller 102 generates the amplifier control signal(s) based on a signal received from a communications controller, which may, in turn, be based on a quality of service (QoS) metric of the received signal. The QoS metric of the received signal may be based, at least in part, on the diversity signal received on the diversity antenna 170 (e.g., an input signal received at the input). The QoS metric of the received signal may be further based on a signal received on a primary antenna 160. In some implementations, the controller 102 generates the amplifier control signal(s) based on a QoS metric of the diversity signal without receiving a signal from the communications controller. In some implementations, the QoS metric includes a signal strength. As another example, the QoS metric may include a bit error rate, a data throughput, a transmission delay, or any other QoS metric. In some implementations, the controller 102 controls the gain (and/or current) of the amplifiers in the variable gain amplifiers 110a, 110b. In some implementations, the controller 102 controls the gain of other components of the wireless device based on an amplifier control signal.

In some implementations, the variable gain amplifiers 110a, 110b may include a step-variable gain amplifier configured to amplify received signals with a gain of one of a plurality of configured amounts indicated by an amplifier control signal. In some implementations, the variable gain amplifiers 110a, 110b may include a continuously-variable gain amplifier configured to amplify received signals with a gain proportional to or dictated by the amplifier control signal. In some implementations, the variable gain amplifiers 110a, 110b may include a step-variable current amplifier configured to amplify received signals by drawing a current of one of plurality of configured amounts indicated by the amplifier control signal. In some implementations, the variable gain amplifiers 110a, 110b may include a continuously-variable current amplifier configured to amplify received signals by drawing a current proportional to the amplifier control signal.

Figure 2:
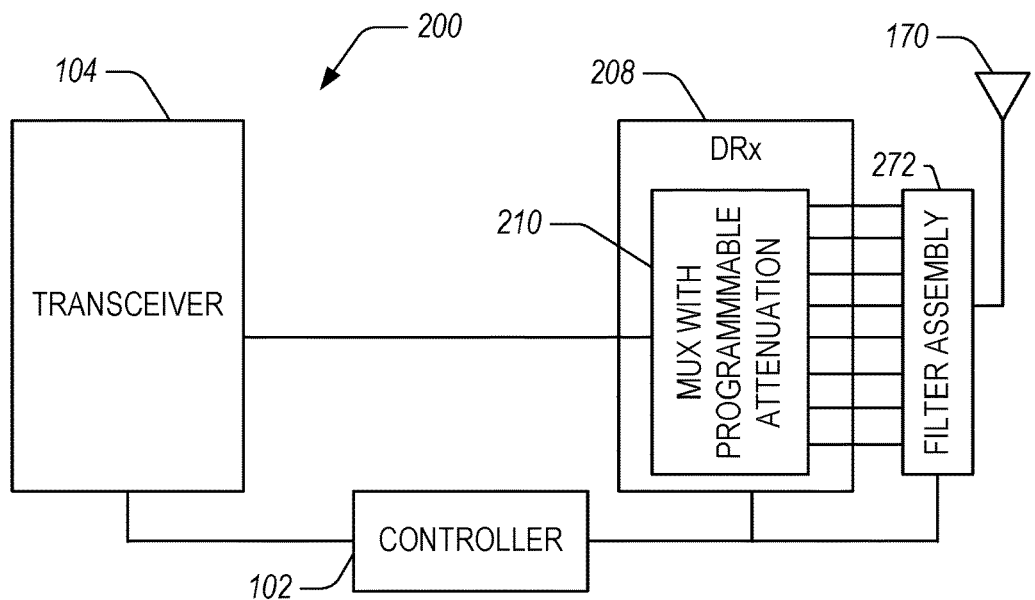
FIG. 2 illustrates a diversity receiver (DRx) configuration including a DRx front-end module (FEM).

FIG. 2 shows a diversity receiver (DRx) configuration 200 including a DRx front-end module (FEM) 208. The DRx configuration 200 includes a diversity antenna 170 that is configured to receive a diversity signal and provide the diversity signal to the DRx FEM 150 through a filter assembly 272. The filter assembly 272 can include a multiplexer, for example, that is configured to selectively direct signals within targeted frequency ranges along respective paths to a multiplexer with programmable attenuation 210. The signals can include cellular signals (e.g., low-, mid-, high- and/or ultra-high-band cellular frequencies) mixed with WLAN signals. In some embodiments, signals directed along a first path include cellular signals (e.g., mid- and/or high-band cellular frequencies) with WLAN signals and signals directed along a second path include cellular signals (e.g., low-band cellular frequencies) without WLAN signals.

The DRx FEM 208 is configured to perform processing on the diversity signals received from the filter assembly 272. For example, the DRx FEM 208 may be configured to filter the diversity signals to one or more active frequency bands that can include cellular and/or WLAN frequency bands. The controller 102 can be configured to control the DRx FEM 208 to selectively direct signals to targeted filters to accomplish the filtering. As another example, the DRx FEM 208 may be configured to amplify one or more of the filtered signals using the multiplexer with programmable attenuation 210. To that end, the DRx FEM 208 may include filters, low-noise amplifiers, band select switches, matching circuits, and other components. The controller 102 can be configured to interact with components in the DRx FEM 208 to intelligently select paths for the diversity signals through the DRx FEM 208. In certain implementations, the filter assembly 272 is located on a die separate from the DRx FEM 208.

The DRx FEM 208 transmits at least a portion of the processed diversity signals to the transceiver 104. The transceiver 104 may be controlled by the controller 102. In some implementations, the controller 102 may be implemented within the transceiver 104.

The DRx FEM 208 can be configured to provide a plurality of gain modes. For the plurality of gain modes, different attenuations can be applied in the multiplexer 210. In one or more gain modes, the multiplexer 210 can be configured to direct signals through an attenuation path that selectively attenuates the signal, such as with a variable and/or programmable attenuator. These programmable attenuators can be embedded onto a multi-input amplifier architecture. In a high gain mode, the multiplexer 210 can be configured to provide a bypass path so that the signal does not pass through the attenuation path. The programmable attenuators can be used before and/or after an amplification stage.

In some embodiments, utilization of programmable attenuation in a multiplexer prior to an amplification stage, e.g., an LNA, can provide improved linearity and/or IIP3. The programmable attenuation can beneficially allow the signal to be matched to a desired or targeted range of the amplifier. In certain implementations, attenuating a signal prior to the amplification stage can increase noise in the signal. However, the DRx configuration 200 can be configured to attenuate signals with a relatively large signal to noise and to bypass attenuation for signals with a relatively low signal to noise. In some embodiments, the DRx configuration 200 is configured to bypass attenuation when operating in a high gain mode and to attenuate signals when operating in other gain modes. This can advantageously allow the DRx configuration 200 to attenuate certain signals to improve linearity while allowing other signals to bypass attenuation to not increase noise in the signal. Another advantage with this configuration is that large signals that enter the DRx FEM 208 can be selectively attenuated so that the amplifier is not damaged by signals that are larger than the amplifier is designed to handle. The embedded attenuators can allow the DRx FEM 208 to tailor attenuation based on signals, gain mode, and amplifier operating characteristics to maintain and/or improve signal quality (e.g., by increasing or maintaining linearity through the amplification process).

In some embodiments, the multiplexer with programmable attenuation 210 is configured to receive a plurality of input signals and provide a single output signal. In certain embodiments, the multiplexer 210 can be configured to receive a plurality of input signals and provide a corresponding plurality of output signals. The multiplexer 210 can be configured to provide a single output signal that is transmitted to a single amplifier, allowing the DRx FEM 210 to use one amplifier or amplification stage for a plurality of frequency bands. This can advantageously reduce the number of components used in the DRx FEM 208, thereby reducing costs associated with manufacturing the DRx FEM 208.

The multiplexer 210 can include switches that provide a plurality of switchable paths through the multiplexer 210. The plurality of switchable paths can correspond to a plurality of frequency bands, each switchable path corresponding to a particular frequency band or particular frequency bands (e.g., overlapping frequency bands). The filter assembly 272 can be configured to direct signals corresponding to particular frequency bands along designated paths to the multiplexer 210. In certain implementations, the switchable paths through the multiplexer 210 can also be configured to selectively direct signals on a particular path through an attenuation path or to bypass the attenuation path. For example, one or more switches can be operated in parallel with a variable attenuator so that in a bypass configuration, the signal passes through the switch and not the variable attenuator (e.g., the switch is closed) and in an attenuation configuration, the signal passes through the variable attenuator (e.g., the switch is open). In the bypass configuration, the signal does not suffer a noise penalty associated with the attenuation configuration. This can advantageously allow the DRx FEM 208 to provide variable gain and/or a plurality of gain modes while reducing the impact on the noise figure (NF) relative to configurations that do not selectively attenuate signals or configurations that do not tailor the attenuation of signals.

The switches of the multiplexer 210 can be embedded on the same die as the multiplexer 210. These embedded switches can be configured to selectively provide paths through the multiplexer 210 and can be configured to selectively direct signals along attenuation paths or bypass paths. The attenuation paths can be configured to attenuate signals, wherein the attenuation is tailored to the amplification stage that follows the switchable paths in the multiplexer 210. The DRx FEM 208 with the multiplexer 210 can be an architecture that provides a plurality of switchable paths with programmable attenuation, wherein each switchable path can be amplified using a variable gain amplifier.

The controller 102 can be configured to control the DRx FEM 208 to selectively direct signals to suitable signal paths. For example, the controller 102 and the DRx FEM 208 can control the multiplexer 210 to direct signals along an attenuation path or a bypass path. As another example, the controller 102 and the DRx FEM 208 can control the multiplexer 210 to provide switchable paths through the multiplexer 210 based on desired or targeted cellular signals or WLAN signals. As another example, the controller 102 and the DRx FEM 208 can control the multiplexer 210 to tailor the attenuation applied to signals directed along the attenuation path. As another example, the controller 102 and the DRx FEM 208 can provide a plurality of gain modes.

Example Architectures of Variable Gain Amplifiers

Front end modules generally include amplifiers such as low-noise amplifiers (LNAs) to amplify received signals. In wireless devices that provide a variety of gain modes, it may be advantageous to attenuate signals prior to amplifying them. However, this may adversely affect small signals, increasing the noise and making the signal to noise ratio worse.

Accordingly, provided herein are variable gain amplifiers and multiplexers that embed programmable attenuators into switchable paths that allow signals in a high gain mode to bypass attenuation. This advantageously reduces or eliminates performance penalties in the high gain mode. Furthermore, the programmable attenuators can be configured to improve linearity of the amplification process through pre-LNA attenuation in targeted gain modes. Although noise may increase in these gain modes that are attenuated prior to amplification, this increase in noise may be negligible or sufficiently small that the advantages of improved linearity make the trade-off desirable or beneficial.

The programmable attenuators can be embedded into switches that are before and after an amplification stage. These programmable input and output attenuations can be tailored to achieve a targeted gain, noise factor (NF) and linearity (IIP3). Furthermore, these attenuations can be configured to make the amplifier less susceptible to failure when large signals are received because the attenuators can reduce the amplitude of these signals so that they fall within a targeted or suitable range for the amplifier.

Accordingly, described herein are variable gain amplifiers with embedded attenuators in a switching network. The attenuators can be embedded onto switches and can be configured to have little or no effect on a noise factor in a high gain mode because the switching network can provide an attenuation bypass in a high gain mode and an attenuation in other gain modes. The programmable attenuators can be embedded onto a multi-input LNA architecture. For example, an attenuation block can be embedded onto a multi-input switch and an attenuation block can be embedded onto an output switch.

Figure 3A:
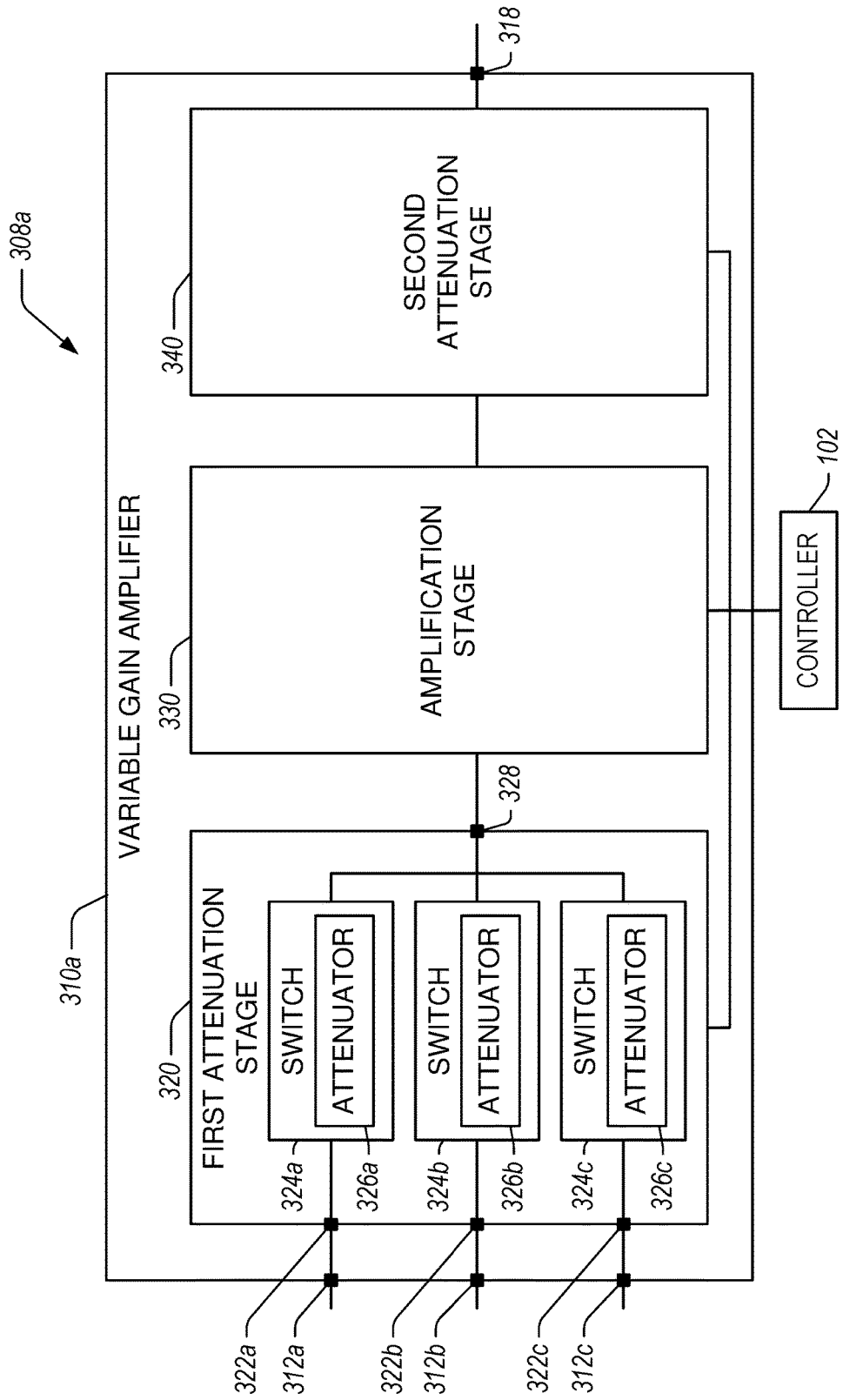
FIG. 3A illustrates an example variable gain amplifier that can be implemented in a front end module, such as a diversity receiver module.

FIG. 3A illustrates an example variable gain amplifier 310a that can be implemented in a front end module 308a, such as a diversity receiver module. The variable gain amplifier 310a includes a first attenuation stage 320, an amplification stage 330, and a second attenuation stage 340. The first attenuation stage 320 provides pre-amplification attenuation and the second attenuation stage 340 provides post-amplification attenuation. A controller 102 can be configured to control operation of the first attenuation stage 320, the amplification stage 330, and the second attenuation stage 340. The controller 102 is configured similarly to the controller 102 described herein with reference to FIGS. 1 and 2.

The variable gain amplifier 310a includes a plurality of input ports 312a-312c configured to receive input signals (e.g., RF signals) and an output port 318 configured to provide a processed (e.g., amplified and/or attenuated) signal. The first attenuation stage 320 includes a plurality of inputs 322a-322c corresponding to the input ports 312a-312c and a common output 328. The first attenuation stage 320 provides a plurality of branches with individual branches having a switch (e.g., switch 324a, 324b, or 324c) and a variable attenuation element (e.g., attenuator 326a, 326b, or 326c) that are configured to selectively provide a path through the first attenuation stage 320. The switches 324a-324c are configured to provide a path through the first attenuation stage 320 and to selectively direct signals through a corresponding attenuator 326a-326c or to bypass the attenuator 326a-326c. A signal directed along an individual path through the first attenuation stage 320 can be selectively attenuated using a tailored attenuation at a corresponding attenuator 326a-326c or to bypass attenuation. The switches 324a-324c can also be configured to selectively provide a path through the first attenuation stage 320 to the amplification stage 330 for targeted or selected signals. For example, the switches 324a-324c can be configured to direct signals through the first attenuation stage 320 that arrive at certain input ports while blocking signals from other input ports so that they do not arrive at output port 328.

The amplification stage 330 is configured to amplify signals received from the first attenuation stage 320 and to pass the amplified signals to the second attenuation stage 340. In this way, the variable gain amplifier 310a can be configured to provide multiplexed output because the first attenuation stage 320 receives signals at a plurality of input ports 322a-322c and the amplification stage 330 receives an input signal at a single input port and provides a processed signal at a single output port. The amplification stage 330 can include any suitable amplifier circuit configured to provide a desired or targeted amplification. In some embodiments, the amplification stage 330 includes a single low-noise amplifier (LNA) circuit configured to amplify signals from a plurality of frequency bands (e.g., cellular frequency bands and/or WLAN frequency bands). Thus, as used herein, the first attenuation stage 320 can be referred to as pre-LNA attenuation and the second attenuation stage 340 can be referred to as post-LNA attenuation. However, it is to be understood that the embodiments described herein are not to be limited to implementations that utilize low-noise amplifiers but include implementations that use a variety of amplifiers in the variable gain amplifier 310a.

The amplification stage 330 can be configured to amplify signals based at least in part on a plurality of gain modes. For example, the amplification stage 330 can be configured to provide a first amplification or gain for a first gain mode, a second amplification or gain for a second gain mode, and so on. The amplification stage 330 can be controlled by the controller 102 to control the gain provided at the amplification stage. For example, the controller 102 can provide a signal indicative of a desired or targeted gain to the amplification stage 330 and the amplification stage 330 can provide the targeted gain. The controller 102 may receive an indication of the targeted gain from another component in a wireless device, for example, and control the amplification stage 330 based at least in part on that indication. Similarly, the first and second attenuation stages 320, 340 can be controlled based at least in part on a gain mode and/or targeted gain of the variable gain amplifier 310a.

The second attenuation stage 340 can be configured in a manner similar to the first attenuation stage 320. In particular, the second attenuation stage 340 can be similar to the first attenuation stage 320 that is configured to receive a signal at a single input and to provide a signal at a single output. The second attenuation stage 340 is configured to receive a multiplexed output from the amplification stage 330 and to direct the signal along switchable paths to selectively attenuate the signal with programmable attenuation or to bypass attenuation. In certain embodiments, the second attenuation stage 340 provides at least two switchable paths through the stage, a first path passing through an attenuator and a second path that bypasses the attenuator. In various embodiments, the second attenuation stage 340 provides a single path through the stage wherein the signal is attenuated with a fixed or programmable attenuation. The signal output from the second attenuation stage 340 is passed to the output port 318 of the variable gain amplifier 310a.

Accordingly, FIG. 3A illustrates a variable-gain signal amplifier 310a that includes a first attenuation stage 320 having a plurality of branches, each branch including a switch 324a-324c and a variable-attenuation element 326a-326c. The first attenuation stage 320 includes an input 322a-322c for each branch and a common output 328. The variable gain amplifier 310a includes an amplification stage 330 coupled to the common output 328 of the first attenuation stage 320 to provide a multiplexed output. The variable gain amplifier 310a includes a second attenuation stage 340 configured to receive the multiplexed output of the amplification stage 330 to provide an amplified output signal to maintain various desired characteristics across a range of gain levels. Each branch through the first attenuation stage 320 can include a bypass path and an attenuation path controlled by a switch. The attenuation path includes a variable or fixed attenuation for each branch.

The variable gain signal amplifier 310a can be configured to achieve relatively low noise and high linearity (e.g., higher IIP3) relative to amplifiers without an embedded switching network with programmable attenuators. The variable gain signal amplifier 310a can be configured to amplify radio frequency (RF) signals such as cellular signals, WLAN signals, BLUETOOTH® signals, GPS signals, and the like. The variable gain signal amplifier 310a can be configured to provide broadband capabilities by receiving signals over a plurality of frequency bands at the multiple inputs 312a-312c and processing these signals. The variable gain signal amplifier 310a can be configured to independently process signals at the respective inputs 312a-312c. The variable gain signal amplifier 310a can be configured to be controlled by a control circuit assembly, such as the controller 102. The control circuit assembly can intelligently and selectively switch paths in the first attenuation stage 320 and can selectively program attenuations provided by the attenuators 326a-326c.

As described herein, the variable gain signal amplifier 310a provides a high gain mode that does not suffer from a performance penalty experienced by other gain modes due to passing through an attenuator prior to amplification. By embedding attenuators to existing switching architectures, high gain or other gain modes can be configured to bypass attenuation thereby eliminating a source of noise in the processing chain. In some implementations, the variable gain signal amplifier 310a is a multi-input LNA with tunable pre- and/or post-LNA attenuations. The pre-LNA attenuation can be used to meet targeted linearity when signals are large, for example. In certain implementations, a single amplifier or LNA can be used for multiple cellular bands.

Figure 3B:
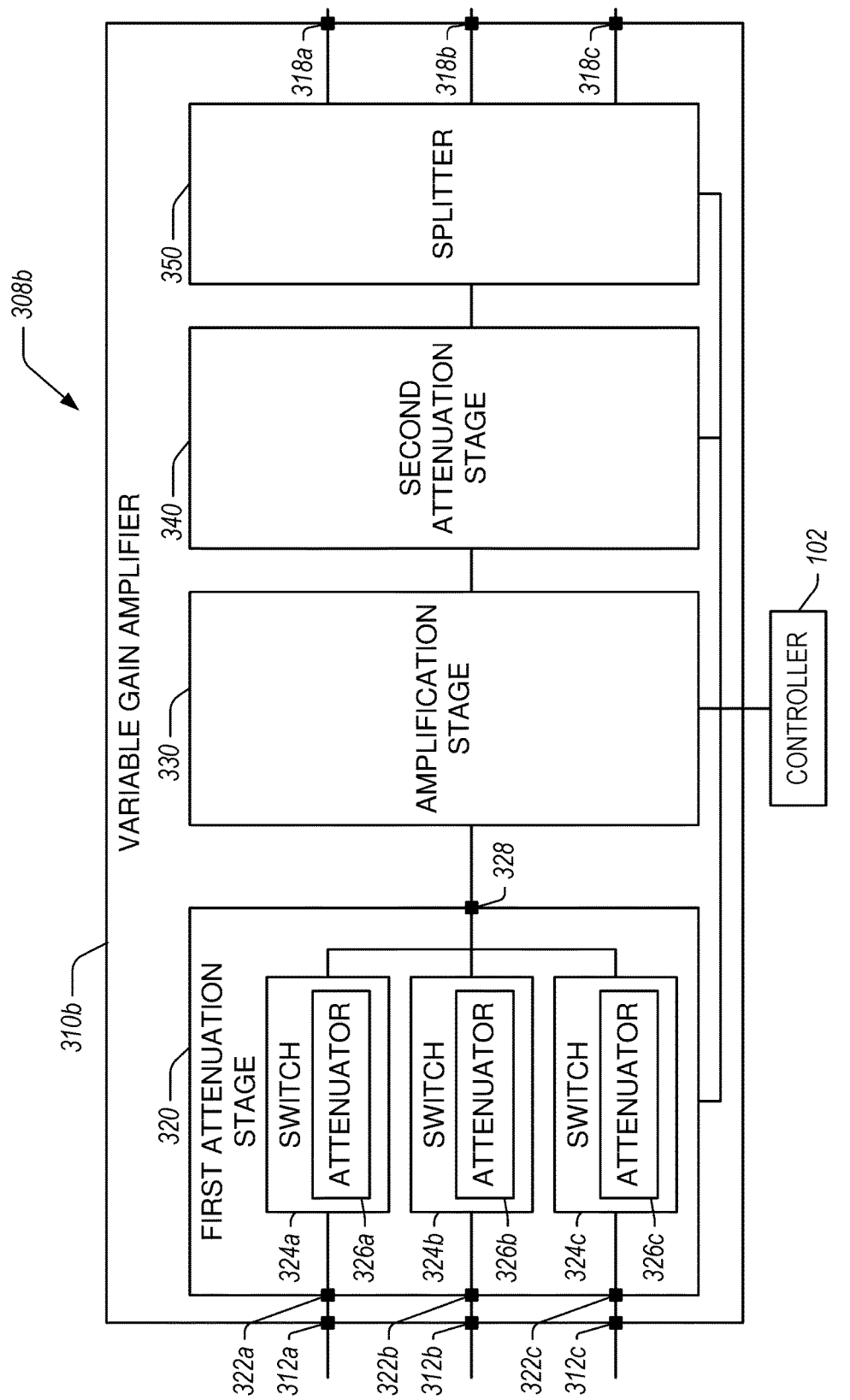
FIG. 3B illustrates an example of a variable gain amplifier that is configured similarly to the variable gain amplifier of FIG. 3A.

FIG. 3B illustrates an example of a variable gain amplifier 310b that is configured similarly to the variable gain amplifier 310a described herein with reference to FIG. 3A. The variable gain amplifier 310b includes a splitter 350 configured to receive a signal at a single input port and to provide signals at a plurality of output ports. The splitter 350 is controlled by the controller 102 to direct input signals to a targeted output. Accordingly, the variable gain amplifier 310b can be configured to receive signals at a plurality of inputs 312a-312c and to provide processed signals at a corresponding plurality of outputs 318a-318c. These signals can be selectively attenuated and amplified, as described herein with reference to FIG. 3A.

Thus, FIG. 3B illustrates a variable-gain amplifier 310b that includes a first attenuation stage 320 having a plurality of branches, each branch including a switch 324a-324c and a variable-attenuation element 326a-326c. The first attenuation stage 320 includes a common output 328 and an input 322a-322c for each branch. The variable gain amplifier 310b includes an amplification stage 330 coupled to the common output 328 of the first attenuation stage 320 to provide a multiplexed output. The variable gain amplifier 310b includes a second attenuation stage 340 configured to receive the multiplexed output of the amplification stage 330 to provide an amplified output signal to maintain various desired characteristics across a range of gain levels. The variable gain amplifier 310b includes a splitter 350. Each branch through the first attenuation stage 320 can include a bypass path and an attenuation path controlled by a switch. The attenuation path includes a variable or fixed attenuation for each branch.

Figure 4:
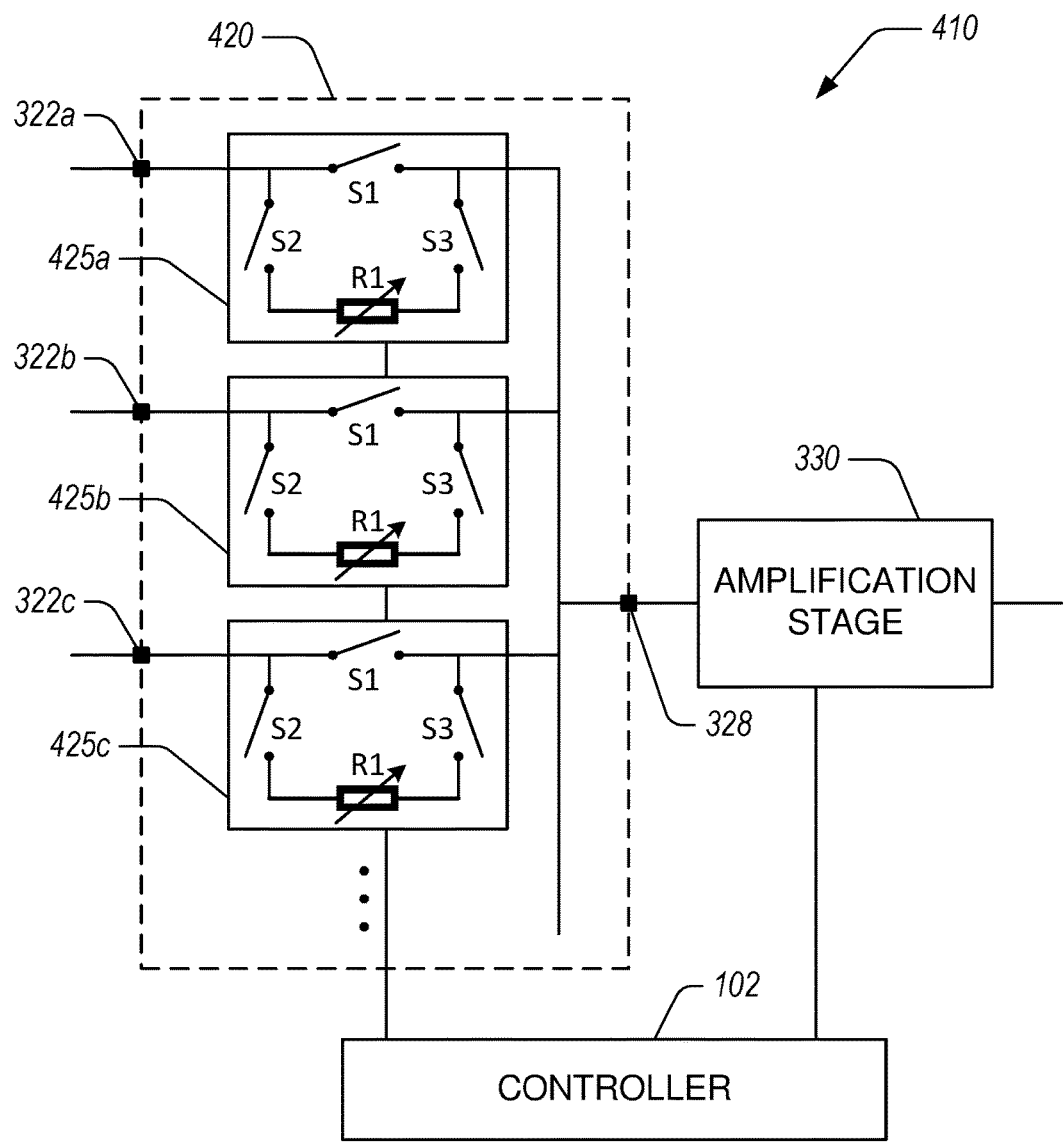
FIG. 4 illustrates an example variable gain amplifier having a first attenuation stage with a plurality of inputs and a common output.

FIG. 4 illustrates an example variable gain amplifier 410 having a first attenuation stage 420 with a plurality of inputs 322a-322c and a common output 328. The signals output at the common output 328 are directed to an amplification stage 330, as described herein with reference to FIGS. 3A and 3B. The variable gain amplifier 410 includes a controller 102 configured to provide control signals to the first attenuation stage 420 and the amplification stage 330. These control signals can be configured to control attenuation and/or amplification provided by the variable gain amplifier 410.

Between the plurality of inputs 322a-322c and the common output 328 of the first attenuation stage 420, a plurality of branches 425a-425c are provided to provide switchable paths through the stage. Signals received at individual inputs 322a-322c are directed to a corresponding branch 425a-425c, the corresponding branch 425a-425c configured to selectively provide a path through the branch 425a-425c to the common output 328. If a path is provided through the branch 425a-425c, the first attenuation stage 420 can be further configured to selectively direct the signal path through a variable attenuator R1 or to bypass the attenuator R1. It is to be understood that although three inputs 322a-322c and branches 425a-425c are illustrated, the variable gain amplifier 410 can include any suitable number of inputs and corresponding branches. For example and without limitation, the variable gain amplifier 410 can include at least 2 inputs and corresponding branches, at least 4 inputs and corresponding branches, at least 8 inputs and corresponding branches, at least 16 inputs and corresponding branches, at least 32 inputs and corresponding branches, at least 64 inputs and corresponding branches, or at least any number of inputs and corresponding branches in the described ranges. As another example and without limitation, the variable gain amplifier 410 can include less than or equal to 64 inputs and corresponding branches, less than or equal to 32 inputs and corresponding branches, less than or equal to 16 inputs and corresponding branches, less than or equal to 8 inputs and corresponding branches, less than or equal to 4 inputs and corresponding branches, or less than or equal to any number of inputs and corresponding branches in the described ranges.

By way of example, an individual branch 425a-425c can be configured to open suitable switches so that there is no signal path through the branch. The first attenuation stage 420 can thus be configured to select signals or frequency bands to process by selectively providing paths from inputs 322a-322c to the output 328.

By way of example, when the first attenuation stage 420 provides a path from an input 322a-322c through a corresponding branch 425a-425c to the output 328, individual branches 425a-425c can be further configured to selectively provide paths that attenuate signals or that bypass attenuation. To bypass attenuation, such as in a high gain mode, a branch 425a-425c closes the switch S1 and opens switches S2 and S3. To attenuate the signal, such as in other gain modes, a branch 425a-425c opens switch S1 and closes switches S2 and S3 so that the signal passes through variable attenuator R1. The switches S1-S3 can be any suitable component or combination of components that provide switching capabilities. The variable attenuator R1 can be any suitable component or combination of components that provide a programmable attenuation. The variable attenuator R1 can be configured to provide varying levels of attenuation based at least in part on signals received from the controller 102, the gain mode provided by the variable gain amplifier 410, or a combination of both. The variable attenuators R1 can be programmable attenuators that are embedded into input switches. This can reduce or eliminate negative impacts on the noise factor (NF) in certain gain modes that bypass the attenuators, such as high gain modes.

Figure 5:
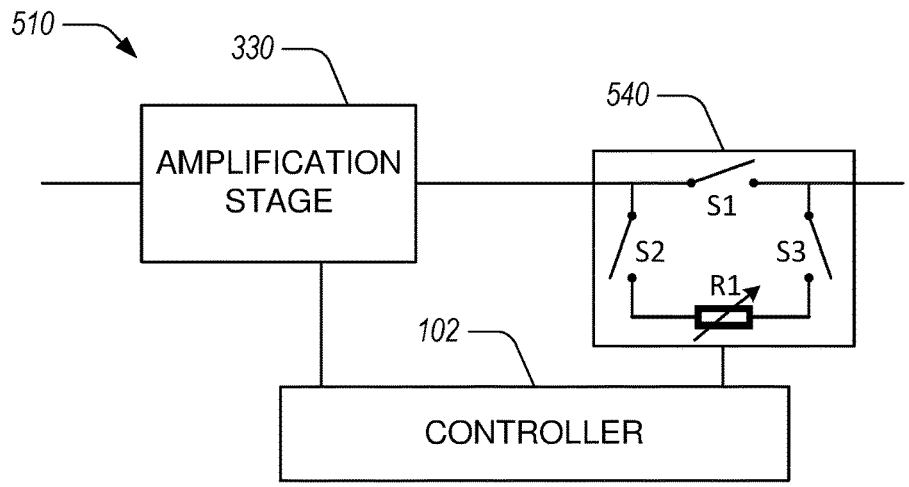
FIG. 5 illustrates an example variable gain amplifier having an amplification stage and a second attenuation stage.

FIG. 5 illustrates an example variable gain amplifier 510 having an amplification stage 330, as described herein with reference to FIGS. 3A and 3B, and a second attenuation stage 540. The variable gain amplifier 510 includes a controller 102 configured to provide control signals to the amplification stage 330 and the second attenuation stage 540. These control signals can be configured to control attenuation and/or amplification provided by the variable gain amplifier 510.

The second attenuation stage 540 can be configured to selectively direct signals received from the amplification stage 330 through a variable attenuator R1 or to bypass the attenuator R1. To bypass attenuation, such as in a high gain mode, the second attenuation stage 540 closes the switch S1 and opens switches S2 and S3. To attenuate the signal, such as in other gain modes, the second attenuation stage 540 opens switch S1 and closes switches S2 and S3 so that the signal passes through variable attenuator R1. The variable attenuator R1 can be embedded onto the output switch. The variable attenuator R1 may be bypassed in certain gain modes, reducing or eliminating the negative effects of attenuating signals for these gain modes, such as a high gain mode.

Figure 6:
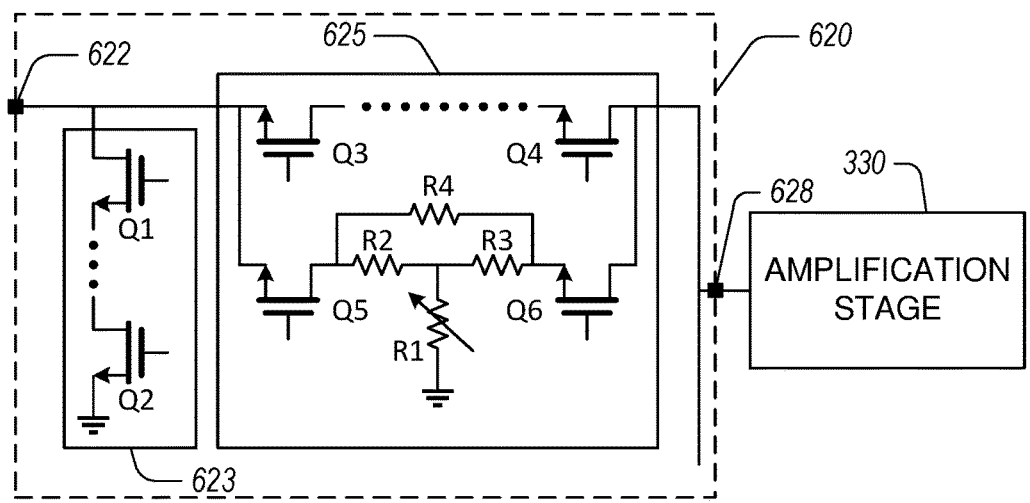
FIG. 6 illustrates an example multiplexer having an input port, a band selection switch, an attenuation selection branch, and an output port.

FIG. 6 illustrates an example multiplexer 620 having an input port 622, a band selection switch 623, an attenuation selection branch 625, and an output port 628. For clarity, a single branch through the multiplexer 620 is illustrated, but it is to be understood that multiple switches and branches through the multiplexer can be provided, as described in greater detail herein with reference to FIG. 4, and these signals can be output at the common output port 628. Signals that pass from the input port 622 to the output port 628 are transmitted to an amplification stage 330, described in greater detail herein with reference to FIGS. 3A and 3B. It is also to be understood that the multiplexer 620 and the amplification stage 330 can be controlled by a controller (not shown), as described in greater detail herein with reference to FIGS. 3A-5. Because the multiplexer 620 includes an attenuation selection branch 625, the multiplexer 620 may be also referred to as an attenuation stage, such as the attenuation stages 320, 420 described in greater detail herein with respect to FIGS. 3A, 3B and 4.

With reference to FIG. 6, the band selection switch 623 allows the multiplexer 620 to select which signals are passed to the amplification stage 330. This can be used to select signals from targeted, selected, or desired frequency bands. With multiple branches in the multiplexer 620, corresponding band selection switches 623 can be used to select targeted frequency bands for processing. These band selection switches 623 can be opened and closed in any suitable pattern (e.g., based on time) or based on signals received from a controller. In this way, the multiplexer 620 and the amplification stage 330 are configured to provide a multiplexed output. The band selection switch 623 includes transistors Q1, Q2 configured to selectively direct signals to a ground potential or other reference voltage. The band selection switch 623 can include other components to provide suitable bias voltages to operate the transistors Q1, Q2 and/or to provide impedance matching or other signal conditioning elements.

The attenuation selection branch 625 is configured to selectively provide an attenuation path through variable attenuator R1 and a bypass path through transistors Q3 and Q4. The attenuation path is controlled by the transistors Q5 and Q6 and includes variable attenuator R1 and resistors R2-R4. The resistors R2-R4 can have fixed resistance values and can be selected to provide desirable signal characteristics across a range of gain modes, signal amplitudes, and/or programmed attenuations. The variable attenuator R1 can be configured to have a plurality of values that depend at least in part on an operating gain mode, frequency band, signal amplitude, or the like. The bypass path is controlled by the transistors Q3 and Q4 and may include additional electrical components (not shown) to provide desirable signal characteristics across a range of gain modes, signal amplitudes, and/or programmed attenuations. In some embodiments, the bypass path is selected when operating in a high gain mode and the attenuation path is selected when operating in other gain modes.

The multiplexer 620 can be configured as a multiplexer having variable gain in each branch. The programmable attenuation can be provided in a switching stage or switching network prior to the amplification stage 330. This switching stage can include a plurality of attenuation selection branches 625.

Figure 7:
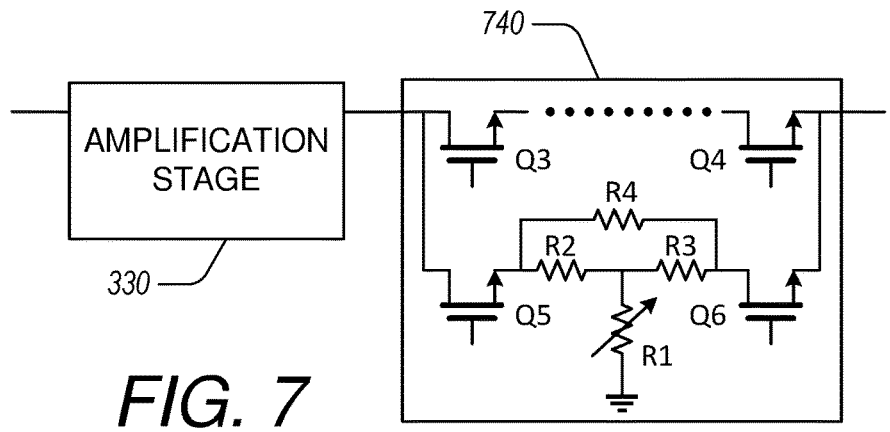
FIG. 7 illustrates an example post-amplification attenuation stage configured to provide an attenuation path and a bypass path.

FIG. 7 illustrates an example post-amplification attenuation stage 740 configured to provide an attenuation path and a bypass path. Signals received from an amplification stage 330, described in greater detail herein with reference to FIGS. 3A and 3B, can be selectively attenuated using a programmable attenuator R1. It is to be understood that the post-amplification attenuation stage 740 and the amplification stage 330 can be controlled by a controller (not shown), as described in greater detail herein with reference to FIGS. 3A-5. The post-amplification attenuation stage 740 may be implemented as a second attenuation stage 340, 540, described in greater detail herein with respect to FIGS. 3A, 3B and 5.

Similar to the attenuation selection branch 625 described with reference to FIG. 6, the post-amplification attenuation stage 740 is configured to selectively provide an attenuation path through variable attenuator R1 and a bypass path through transistors Q3 and Q4. The attenuation path is controlled by the transistors Q5 and Q6 and includes variable attenuator R1 and resistors R2-R4. The resistors R2-R4 can have fixed resistance values and can be selected to provide desirable signal characteristics across a range of gain modes, signal amplitudes, and/or programmed attenuations. The variable attenuator R1 can be configured to have a plurality of values that depend at least in part on an operating gain mode, frequency band, signal amplitude, or the like. The bypass path is controlled by the transistors Q3 and Q4 and may include additional electrical components (not shown) to provide desirable signal characteristics across a range of gain modes, signal amplitudes, and/or programmed attenuations. In some embodiments, the bypass path is selected when operating in a high gain mode and the attenuation path is selected when operating in other gain modes.

Figure 8A:
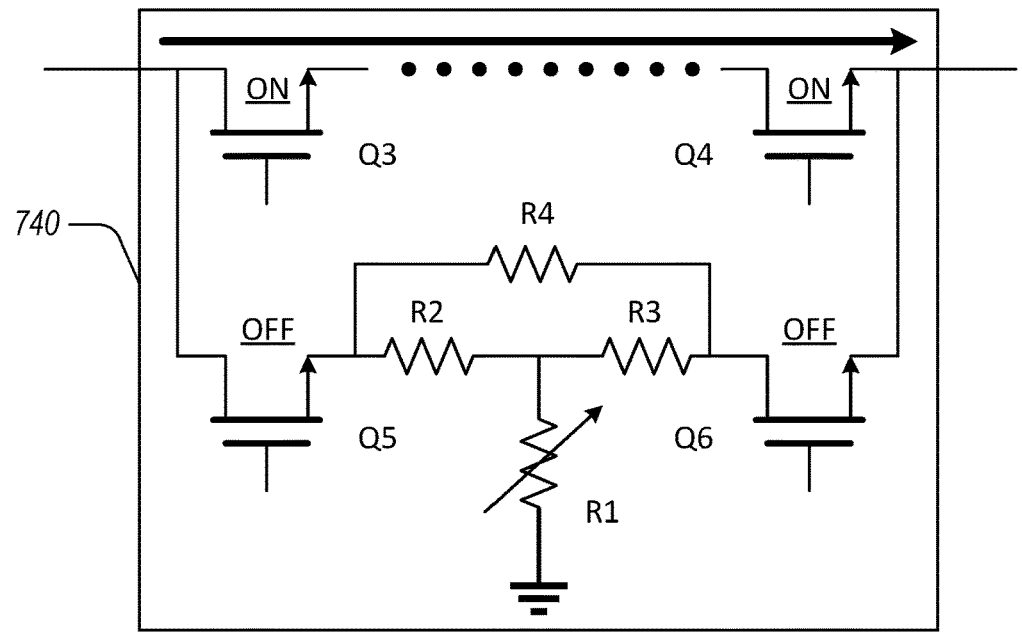
FIGS. 8A and 8B illustrate examples of an attenuation stage operating respectively in a bypass mode and in an attenuation mode.
Figure 8B:
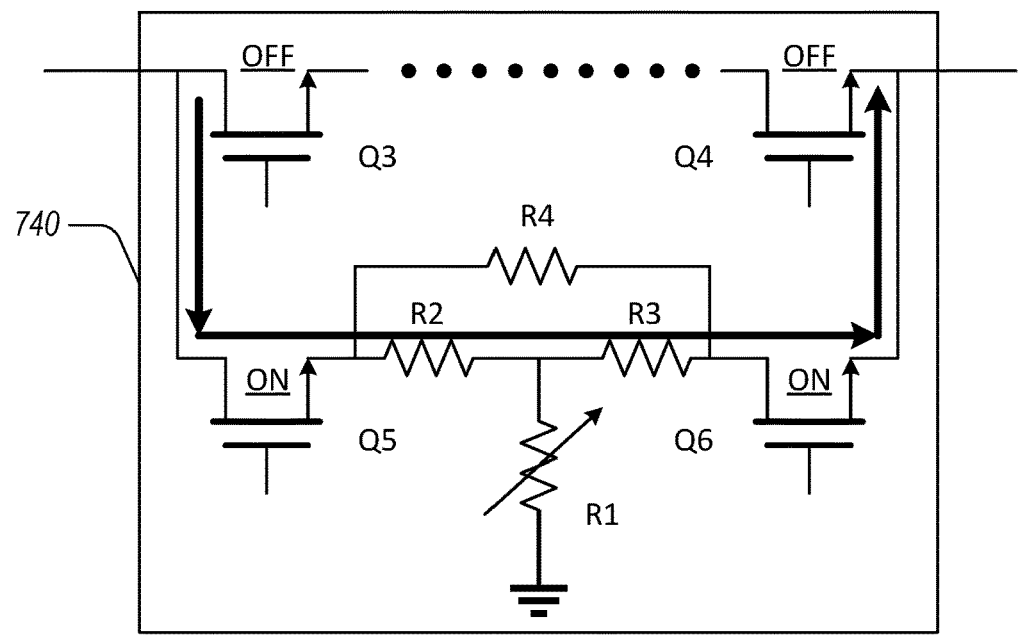

FIGS. 8A and 8B illustrate examples of an attenuation stage 740 operating in a bypass mode (FIG. 8A) and in an attenuation mode (FIG. 8B). The attenuation stage 740 can be a post-amplification stage as described herein with reference to FIG. 7 or a branch in a pre-amplification stage or multiplexer as described herein with reference to FIG. 6. In the bypass mode illustrated in FIG. 8A, the transistors Q3, Q4 are activated while the transistors Q5, Q6 are deactivated. In this configuration, signals pass through the electrical components, if any, provided between the transistors Q3, Q4 before exiting the attenuation stage 740. In the attenuation mode illustrated in FIG. 8B, the transistors Q3, Q4 are deactivated while the transistors Q5, Q6 are activated. In this configuration, signals pass through resistors R2-R4 and variable attenuator R1 before exiting the attenuation stage 740. Activation and deactivation of the transistors can be controlled by a controller (not shown). The value of the variable attenuator R1 can be controlled by a controller (not shown). Although not shown for the sake of clarity, the attenuation stage 740 can include other electrical components configured to provide suitable control signals and bias voltages to the transistors Q3-Q6 and the variable attenuator R1.

Figure 9A:
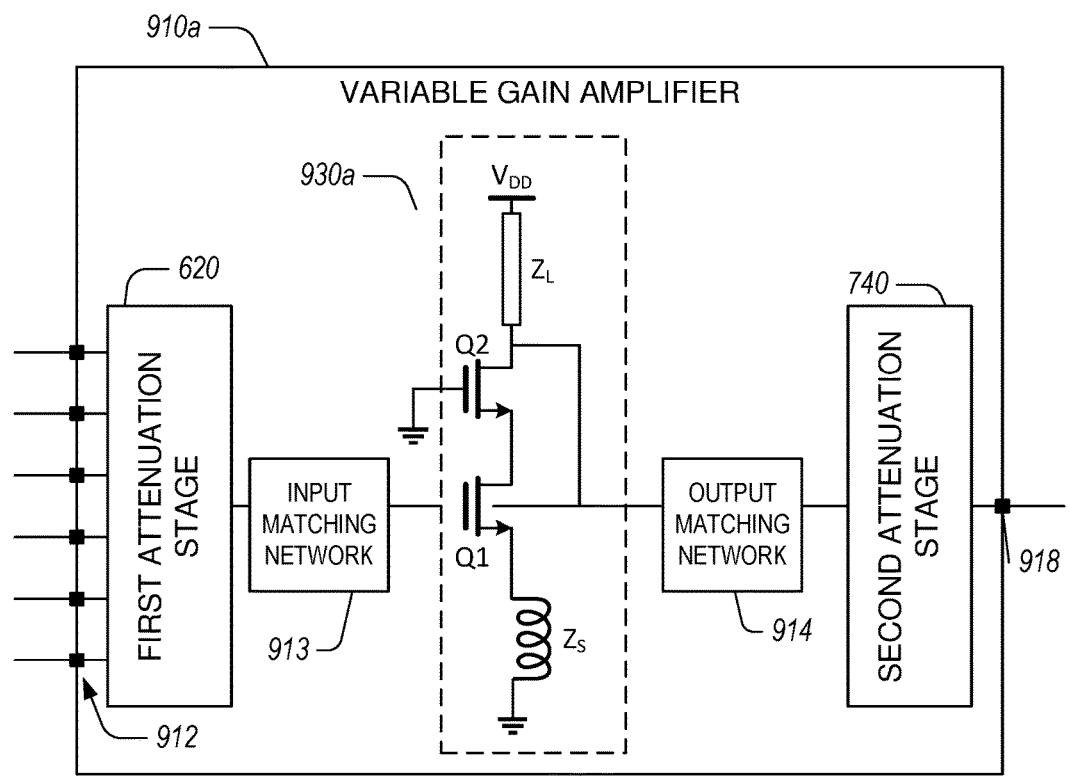
FIGS. 9A and 9B illustrate example variable gain amplifiers that include a pre-amplification attenuation stage, respective amplification stages, an output matching network, and a post-amplification attenuation stage.
Figure 9B:
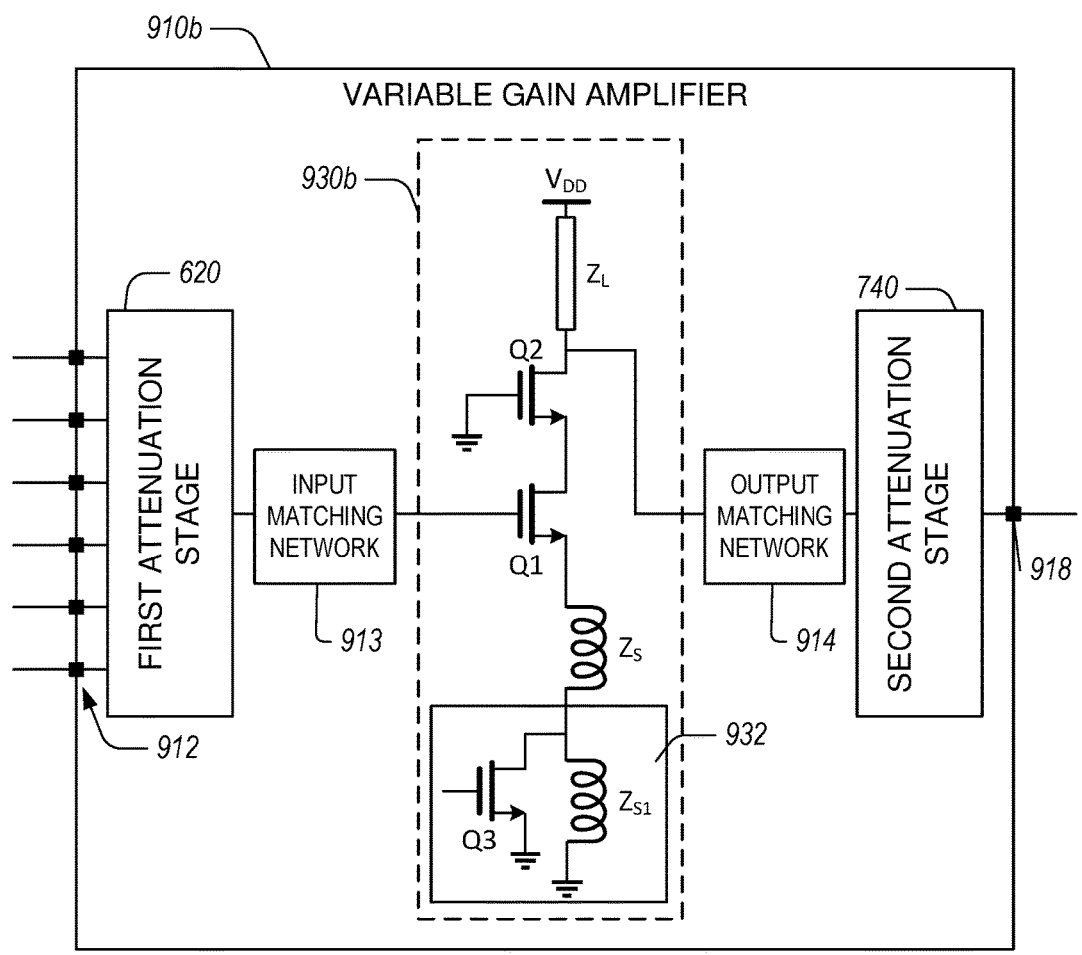

FIGS. 9A and 9B illustrate example variable gain amplifiers 910a, 910b that include a pre-amplification attenuation stage 620, respective amplification stages 930a, 930b, an input matching network 913, an output matching network 914, and a post-amplification attenuation stage 740. The variable gain amplifiers 910a, 910b include a plurality of input ports 912 and a common output port 918. The pre-amplification attenuation stage 620 can be configured similar to the attenuation stage or multiplexer 620 described in greater detail herein with reference to FIG. 6. The post-amplification attenuation stage 740 can be configured similar to the attenuation stage 740 described in greater detail herein with reference to FIG. 7.

With reference to FIG. 9A, the amplification stage 930a can include a cascode amplifier that includes transistors Q1, Q2, a voltage source VDD, a load ZL, and inductance element ZS that together amplify signals received through the input matching network 913. The output matching network 914 includes components configured to match impedances of the amplification stage 930a to maintain desirable signal characteristics. For example, the output matching network 913 can include one or more capacitors, one or more resistors, a combination of capacitors or resistors in series or in parallel, or the like. The input matching network 913 includes components configured to match impedances of the first attenuation stage 920 to maintain desirable signal characteristics. For example, the input matching network 914 can include one or more capacitors, one or more resistors, a combination of capacitors or resistors in series or in parallel, or the like. In some embodiments, the input matching network 913 can be included in the amplification stage 930a.

With reference to FIG. 9B, the amplification stage 930b is similar to the amplification stage 930a and additionally includes a degeneration switching block 932. The degeneration switching block 932 includes a second inductance ZS1 and transistor Q3. The degeneration switching block 932 is configured to add additional inductance element ZS1 in one or more gain modes. For example, in a selected gain mode the degeneration switching block 932 can deactivate the transistor Q3 so that the path to ground or other reference voltage passes through both the inductance element ZS and inductance element ZS1. In other gain modes, the degeneration switching block 932 can activate the transistor so that the path to ground or other reference voltage passes through the inductance element ZS and not the inductance element ZS1. This can affect the noise figure (NF) and/or linearity (IIP3) of the amplification stage 930b, as described in greater detail herein with reference to FIG. 10B.

Figure 10A:
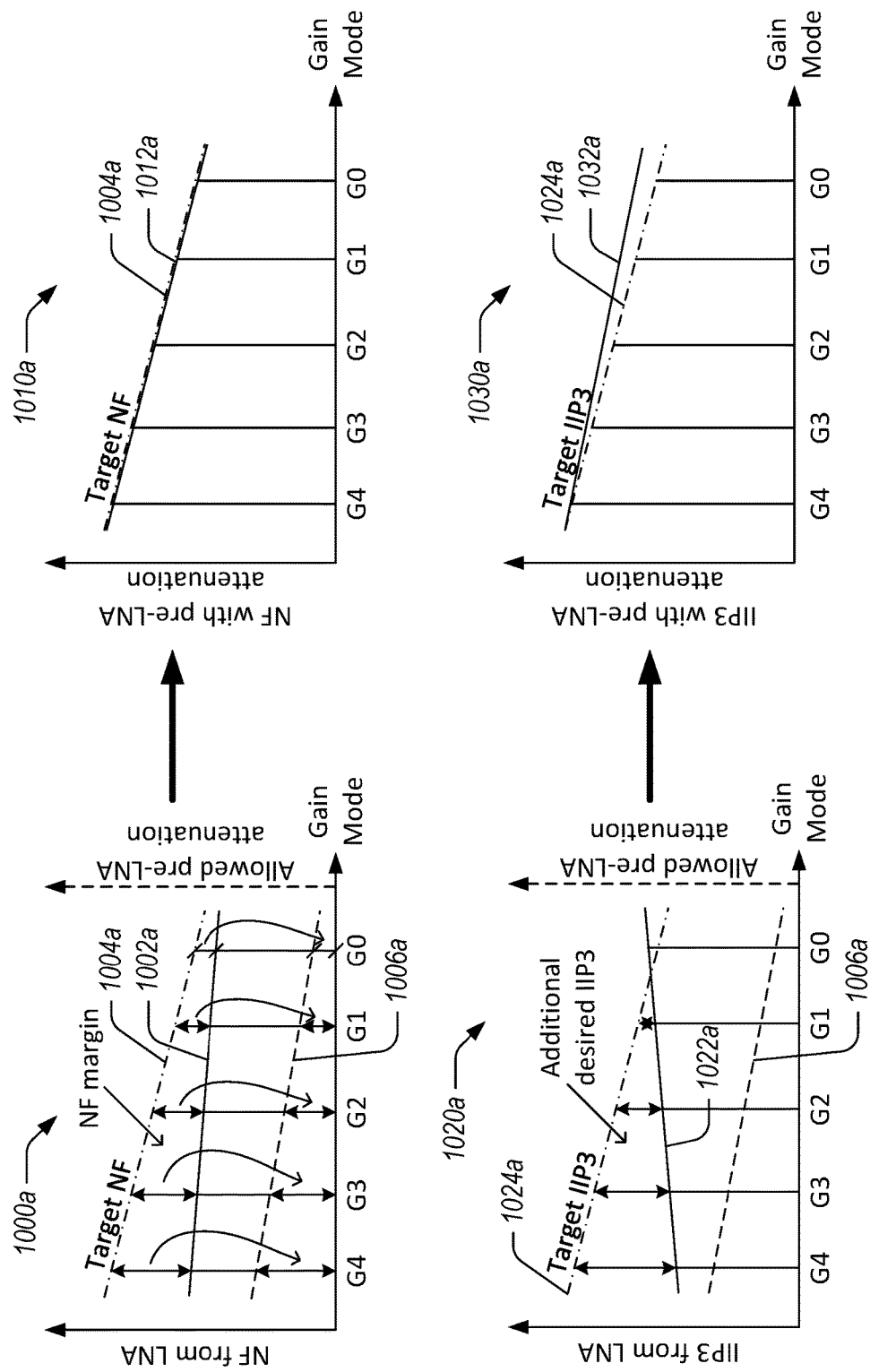
FIGS. 10A and 10B illustrate plots of the performance of the variable gain amplifiers of FIGS. 9A and 9B.
Figure 10B:
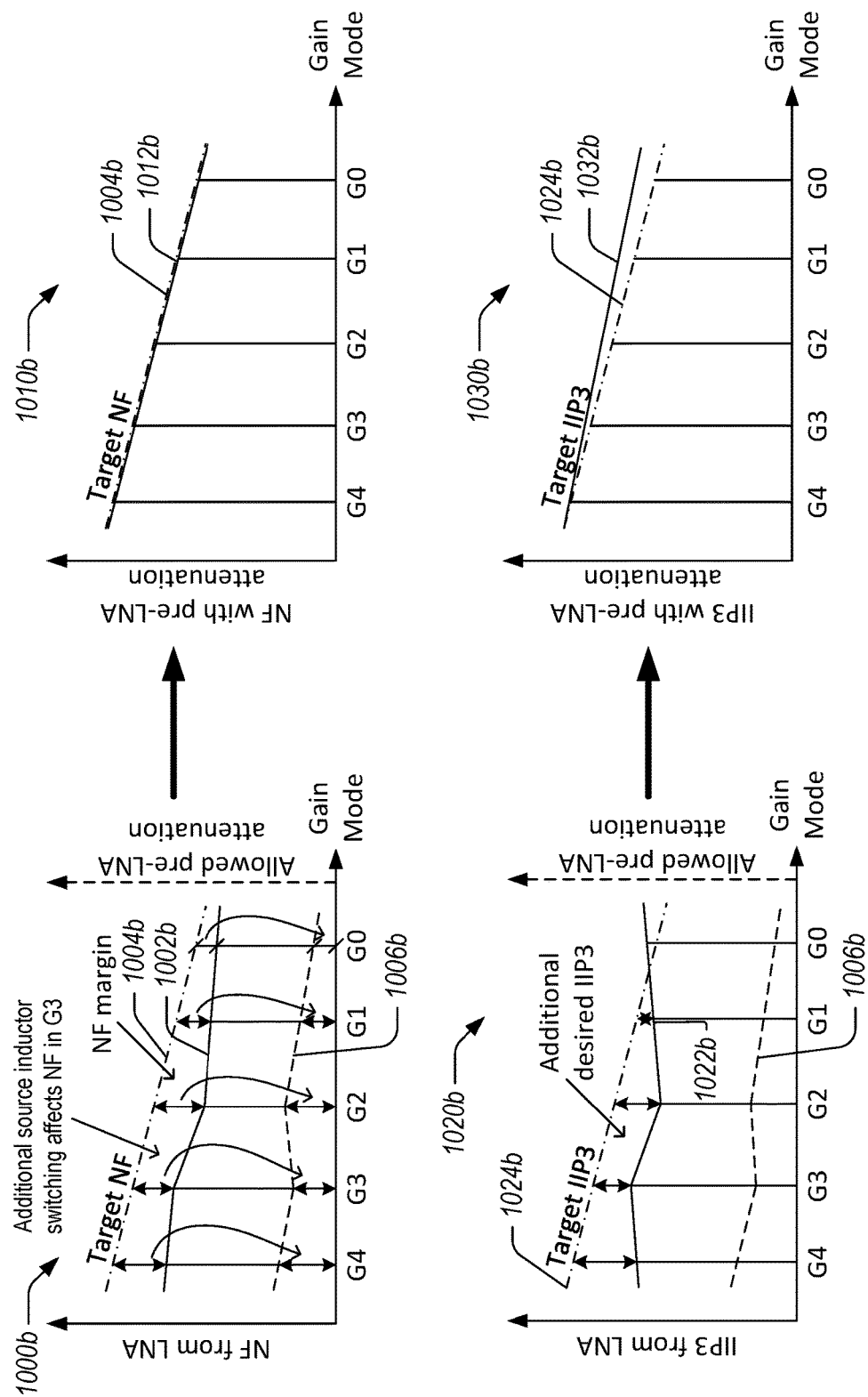

FIGS. 10A and 10B illustrate plots of the performance of variable gain amplifiers 910a, 910b, respectively described with reference to FIGS. 9A and 9B. FIG. 10A illustrates plots of the noise figure (NF) and linearity (IIP3) of the variable gain amplifier 910a (described with reference to FIG. 9A) and the effects of including the described pre-amplification attenuation stage 620. Similarly, FIG. 10B illustrates plots of the noise figure (NF) and linearity (IIP3) of the variable gain amplifier 910b (described with reference to FIG. 9B) and the effects of including the described pre-amplification attenuation stage 620.

With reference to FIG. 10A, the top plots show the noise figure (NF) as a function of gain mode, with G4 being a low gain mode and the gain increasing to G0, a high gain mode. On the upper left plot 1000a, the NF from the amplification stage 930a (or LNA) is shown as a solid line 1002a, the NF being without a pre-LNA attenuation stage 620. The target NF is shown as a dashed-dotted line 1004a. The difference between the target NF 1004a and the NF from the LNA 1002a is the allowed pre-LNA attenuation that is shown as a dashed line 1006a (e.g., the NF margin). By programming the variable attenuation of the pre-LNA attenuation stage, the target NF can be achieved, as shown in the upper right plot 1010a. The NF from the LNA with pre-LNA attenuation is shown as the solid line 1012a which is substantially aligned with the target LNA, shown again as the dashed-dotted line 1004a.

With continued reference to FIG. 10A, the bottom plots show linearity (IIP3) as a function of gain mode, with G4 being a low gain mode and the gain increasing to G0, a high gain mode. On the lower left plot 1020a, the IIP3 from the amplification stage 930a (or LNA) is shown as a solid line 1022a, the IIP3 being without a pre-LNA attenuation stage 620. The target IIP3 is shown as a dashed-dotted line 1024a. The allowed pre-LNA attenuation is shown again as the dashed line 1006a. By programming the variable attenuation of the pre-LNA attenuation stage, linearity that exceeds the target IIP3 can be achieved, as shown in the plot 1030a. The IIP3 from the LNA with pre-LNA attenuation is shown as the solid line 1032a which exceeds the target IIP3, shown again as the dashed-dotted line 1024a.

The plots in FIG. 10A illustrate that the disclosed variable gain amplifiers can be configured to achieve a targeted or higher IIP3 in non-high gain modes. Furthermore, with the allowed NF margin, pre-LNA attenuation can be tailored to achieve a targeted front-end loss to boost linearity (IIP3) performance in low gain modes.

Proceeding to FIG. 10B, the plots 1000, 1010b, 1020b, 1030b illustrate the same parameters as described in FIG. 10A replacing the amplification stage 930a with the amplification stage 930b that includes a degeneration switching block 932. In other words, a difference between the variable gain amplifiers 910a, 910b includes the presence of the degeneration switching block 932 in the variable gain amplifier 910b. In the plots of FIG. 10B, the effect of switching on the degeneration block for gain mode G3 is seen in the NF and IIP3 plots.

The top plots show the noise figure (NF) as a function of gain mode, with G4 being a low gain mode and the gain increasing to G0, a high gain mode. On the upper left plot 1000b, the NF from the amplification stage 930b (or LNA) is shown as a solid line 1002b, the NF being without a pre-LNA attenuation stage 620. The target NF is shown as a dashed-dotted line 1004b. The difference between the target NF 1004b and the NF from the LNA 1002b is the allowed pre-LNA attenuation that is shown as a dashed line 1006b (e.g., the NF margin). By programming the variable attenuation of the pre-LNA attenuation stage, the target NF can be achieved, as shown in the upper right plot 1010b. The NF from the LNA with pre-LNA attenuation is shown as the solid line 1012b which is substantially aligned with the target LNA, shown again as the dashed-dotted line 1004b.

With continued reference to FIG. 10B, the bottom plots show linearity (IIP3) as a function of gain mode, with G4 being a low gain mode and the gain increasing to G0, a high gain mode. On the lower left plot 1020b, the IIP3 from the amplification stage 930b (or LNA) is shown as a solid line 1022b, the IIP3 being without a pre-LNA attenuation stage 620. The target IIP3 is shown as a dashed-dotted line 1024b. The allowed pre-LNA attenuation is shown again as the dashed line 1006b. By programming the variable attenuation of the pre-LNA attenuation stage, linearity that exceeds the target IIP3 can be achieved, as shown in the plot 1030b. The IIP3 from the LNA with pre-LNA attenuation is shown as the solid line 1032b which exceeds the target IIP3, shown again as the dashed-dotted line 1024b.

The plots in FIG. 10B illustrate that the disclosed variable gain amplifiers can be configured to achieve a targeted or higher IIP3 in non-high gain modes. Furthermore, with the allowed NF margin, pre-LNA attenuation can be tailored to achieve a targeted front-end loss to boost linearity (IIP3) performance in low gain modes.

Examples of Products and Architectures

Figure 11:
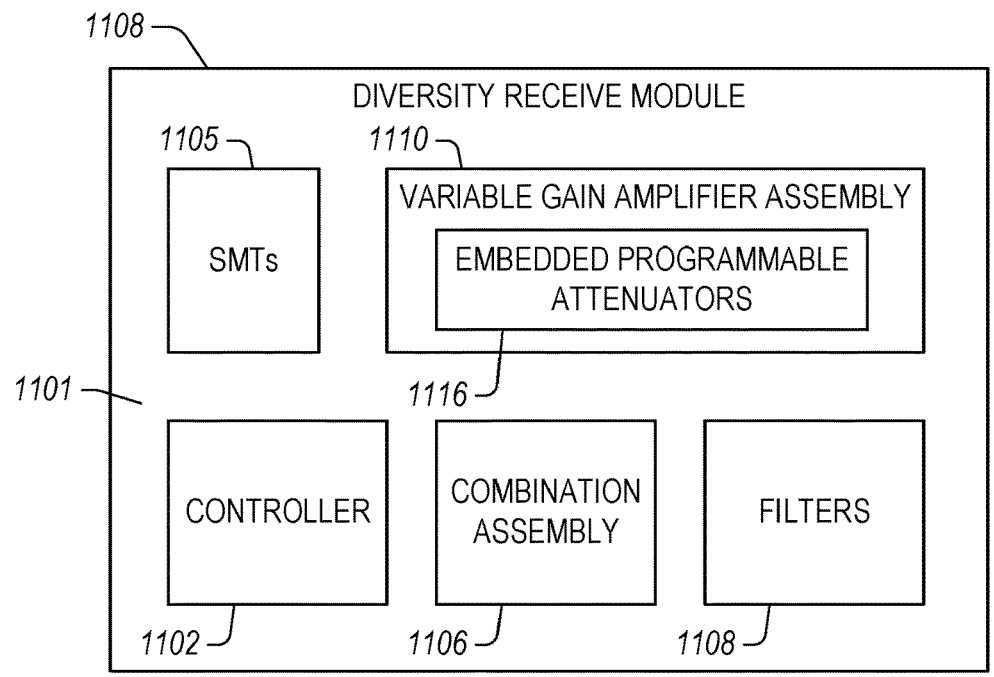
FIG. 11 shows that in some embodiments, some or all of the diversity receiver configurations can be implemented, wholly or partially, in a module.

FIG. 11 shows that in some embodiments, some or all of the diversity receiver configurations, including some or all of the diversity receiver configurations having combinations of features (e.g., FIGS. 1-9B), can be implemented, wholly or partially, in a module. Such a module can be, for example, a front-end module (FEM). Such a module can be, for example, a diversity receiver (DRx) FEM. Such a module can be, for example, a multi-input, multi-output (MiMo) module.

In the example of FIG. 11, a module 1108 can include a packaging substrate 1101, and a number of components can be mounted on such a packaging substrate 1101. For example, a controller 1102 (which may include a front-end power management integrated circuit [FE-PIMC]), a combination assembly 1106, a variable gain amplifier assembly 1110 that includes embedded programmable attenuators 1116 having one or more features as described herein, and a filter bank 1108 (which may include one or more bandpass filters) can be mounted and/or implemented on and/or within the packaging substrate 1101. Other components, such as a number of SMT devices 1105, can also be mounted on the packaging substrate 1101. Although all of the various components are depicted as being laid out on the packaging substrate 1101, it will be understood that some component(s) can be implemented over other component(s).

In some embodiments, the diversity receive module 1108 includes two or more variable gain amplifier assemblies 1110. In various implementations, the two or more variable gain amplifier assemblies 1110 can be implemented on a single die. Each assembly 1110 can include a first attenuation stage, an amplification stage, and a second attenuation stage. The outputs of each assembly 1110 can be joined. This may be advantageous to enable performance tuning across a wider range of frequencies. For example, a first assembly can be tuned for a first frequency range and a second assembly can be tuned for a second frequency range. Signals can be directed to the appropriate assemblies 1110 and joined at a common output. Thus, the diversity receive module 1108 can be configured to cover a wider range of frequencies with improved performance relative to a configuration that includes a single amplifier assembly.

Figure 12:
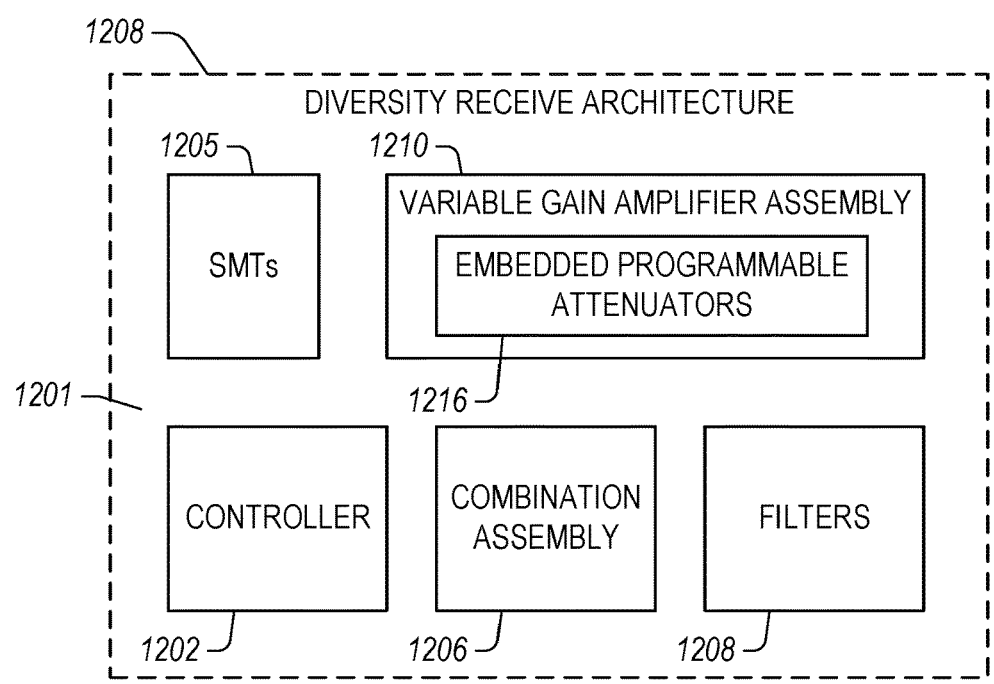
FIG. 12 shows that in some embodiments, some or all of the diversity receiver configurations can be implemented, wholly or partially, in an architecture.

FIG. 12 shows that in some embodiments, some or all of the diversity receiver configurations, including some or all of the diversity receiver configurations having combinations of features (e.g., FIGS. 1-9b), can be implemented, wholly or partially, in an architecture. Such an architecture may include one or more modules, and can be configured to provide front-end functionality such as diversity receiver (DRx) front-end functionality.

In the example of FIG. 12, an architecture 1208 can include a controller 1202 (which may include a front-end power management integrated circuit [FE-PIMC]), a combination assembly 1206, a variable gain amplifier assembly 1210 that includes embedded programmable attenuators 1216 having one or more features as described herein, and a filter bank 1208 (which may include one or more bandpass filters) can be mounted and/or implemented on and/or within the packaging substrate 1201. Other components, such as a number of SMT devices 1205, can also be implemented in the architecture 1208.

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
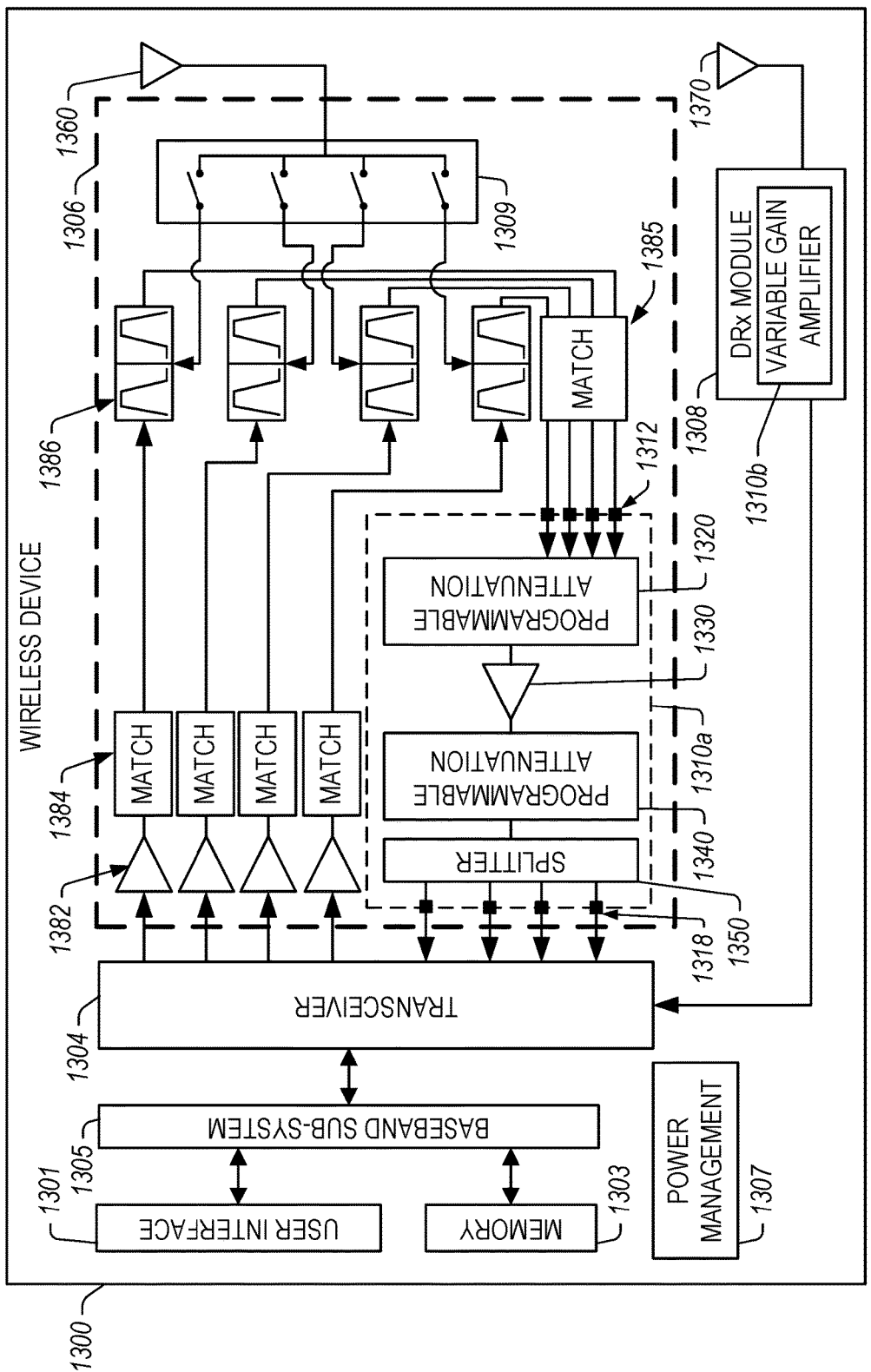
FIG. 13 illustrates an example wireless device having one or more advantageous features described herein.

FIG. 13 depicts an example wireless device 1300 having one or more advantageous features described herein. In the context of one or more modules having one or more features as described herein, such modules can be generally depicted by a dashed box 1306 (which can be implemented as, for example, a front-end module) and a diversity receiver (DRx) module 1308 (which can be implemented as, for example, a front-end module).

Referring to FIG. 13, power amplifiers (PAs) 1382 can receive their respective RF signals from a transceiver 1304 that can be configured and operated to generate RF signals to be amplified and transmitted, and to process received signals. The transceiver 1304 is shown to interact with a baseband sub-system 1305 that is configured to provide conversion between data and/or voice signals suitable for a user and RF signals suitable for the transceiver 1304. The transceiver 1304 can also be in communication with a power management component 1307 that is configured to manage power for the operation of the wireless device 1300. Such power management can also control operations of the baseband sub-system 1305 and the modules 1306 and 1308.

The baseband sub-system 1305 is shown to be connected to a user interface 1301 to facilitate various input and output of voice and/or data provided to and received from the user. The baseband sub-system 1305 can also be connected to a memory 1303 that is configured to store data and/or instructions to facilitate the operation of the wireless device, and/or to provide storage of information for the user.

In the example wireless device 1300, outputs of the PAs 1382 are shown to be matched (via respective match circuits 1384) and routed to their respective duplexers 1386. Such amplified and filtered signals can be routed to a primary antenna 1360 through a switching network 1309 for transmission. In some embodiments, the duplexers 1386 can allow transmit and receive operations to be performed simultaneously using a common antenna (e.g., primary antenna 1360). In FIG. 13, received signals are shown to be routed to a variable gain amplifier assembly 1310*a*, which provides the features and benefits of the variable gain amplifiers described herein. The DRx module 1308 includes a similar variable gain amplifier assembly 1310*b* as well.

In the example wireless device 1300, signals received at the primary antenna 1330 can be matched (via respective match circuits 1385) and can be sent to a variable gain amplifier 1310*a* in the front end module 1306. The variable gain amplifier 1310*a* can include a pre-amplification programmable attenuation assembly 1320, an amplifier 1330, a post-amplification programmable attenuation assembly 1340, and a splitter 1350. The variable gain amplifier 1310*a* is configured to receive a plurality of signals at inputs 1312 and output a plurality of processed signals at outputs 1318. The variable gain amplifier 1310*a* is configured to provide a plurality of switchable paths to the amplifier 1310*a*, the plurality of switchable paths including embedded, programmable attenuators that provide targeted amplification over a plurality of gain modes and that improve linearity for signals relative to variable gain amplifiers that do not include embedded programmable attenuators. In at least one high gain mode, programmable attenuators can be bypassed to reduce or eliminate the impact on the noise figure. In at least one non-high gain mode, programmable attenuators can be tailored to improve linearity for signals being amplified in the at least one non-high gain mode.

The wireless device also includes a diversity antenna 1370 and a diversity receiver module 1308 that receives signals from the diversity antenna 1370. The diversity receive module 1308 includes a variable gain amplifier 1310*b*, similar to the variable gain amplifier 1310*a* in the front end module 1306. The diversity receiver module 1308 and the variable gain amplifier 1310*b* process the received signals and transmit the processed signals to the transceiver 1304. In some embodiments, a diplexer, triplexer, or other multiplexer or filter assembly can be included between the diversity antenna 1370 and the diversity receiver module 1308, as described herein.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1. It is to be understood that the term radio frequency (RF) and radio frequency signals refers to signals that include at least the frequencies listed in Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A variable-gain signal amplifier comprising:
a first attenuation stage having a plurality of branches, each branch including a switch circuit and a variable-attenuation element that are configured so that the switch circuit provides a path that bypasses the variable-attenuation element in a first state, provides a path that passes through the variable-attenuation element in a second state, and eliminates any signal path through the branch in a third state, the first attenuation stage having a common output and an input for each branch;

an amplification stage coupled to the common output of the first attenuation stage to provide a multiplexed output; and a second attenuation stage configured to receive the multiplexed output of the amplification stage to provide an amplified output signal to maintain various desired characteristics across a range of gain levels.

2. The amplifier of claim 1 wherein the signal includes a radio frequency signal.

3. The amplifier of claim 1 wherein the first attenuation stage is configured to provide a bypass path so that a signal received at an input is directed to the common output without being attenuated by the variable-attenuation element.

4. The amplifier of claim 3 wherein the first attenuation stage is configured to provide the bypass path in a high gain mode.

5. The amplifier of claim 4 wherein, in the high gain mode, a noise factor of a signal is not increased due at least in part to bypassing the variable-attenuation element.

6. The amplifier of claim 4 wherein, in other gain modes, IIP3 of the signal is increased due at least in part to tailored attenuation provided by the variable-attenuation element.

7. The amplifier of claim 1 wherein the amplifier is configured to receive signals at respective inputs that cover a plurality of cellular frequency bands.

8. The amplifier of claim 1 wherein the amplifier is configured to attenuate or amplify a signal received at a particular input independent of attenuation or amplification of other signals received at other inputs.

9. The amplifier of claim 1 further comprising a control circuit configured to send control signals to the first attenuation stage, the amplification stage, or the second attenuation stage.

10. The amplifier of claim 9 wherein the control circuit includes a controller configured to provide an amplification control signal in a high gain mode that causes the first attenuation stage to provide a path that bypasses the variable-attenuation element.

11. The amplifier of claim 1 wherein the first attenuation stage is configured to selectively direct targeted signals to the amplification stage.

12. The amplifier of claim 1 further comprising a splitter having an input port coupled to the second attenuation stage to receive the amplified output signal and a plurality of output ports.

13. The amplifier of claim 12 wherein the splitter is configured to direct the amplified output signal to a targeted output port corresponding to a particular input branch of the first attenuation stage.

14. A front end architecture comprising:
a variable gain signal amplifier including a first attenuation stage having a plurality of branches, each branch including a switch circuit and a variable-attenuation element that are configured so that the switch circuit provides a path that bypasses the variable-attenuation element in a first state, provides a path that passes through the variable-attenuation element in a second state, and eliminates any signal path through the branch in a third state, the first attenuation stage having a common output and an input for each branch; an amplification stage coupled to the common output of the first attenuation stage to provide a multiplexed output; and a second attenuation stage configured to receive the multiplexed output of the amplification stage to provide an amplified output signal to maintain various desired characteristics across a range of gain levels;

a filter assembly coupled to the variable gain signal amplifier to direct frequency bands to select inputs of the variable gain signal amplifier; and a controller implemented to control the variable gain signal amplifier to provide a plurality of gain modes such that, in a high gain mode, the variable gain signal amplifier directs signals along a path that bypasses the variable-attenuation element in a particular branch by controlling the switch circuit in the particular branch to be in the first state.

15. The front end architecture of claim 14 wherein, in the high gain mode, a noise factor of a signal is not increased due at least in part to bypassing the variable-attenuation element.

16. The front end architecture of claim 15 wherein, in other gain modes, IIP3 of the signal is increased due at least in part to tailored attenuation provided by the variable-attenuation element.

17. The front end architecture of claim 14 wherein, for individual branches of the plurality of branches, the first attenuation stage is configured to provide an attenuation path that passes through the variable-attenuation element and a bypass path that does not pass through the variable-attenuation element.

18. A wireless device comprising:
a diversity antenna;
a filter assembly coupled to the diversity antenna to receive signals and to direct frequency bands along select paths;
a variable gain signal amplifier coupled to the filter assembly to receive signals from select paths, the variable gain signal amplifier including a first attenuation stage having a plurality of branches, each branch including a switch circuit and a variable-attenuation element that are configured so that the switch circuit provides a path that bypasses the variable-attenuation element in a first state, provides a path that passes through the variable-attenuation element in a second state, and eliminates any signal path through the branch in a third state, the first attenuation stage having a common output and an input for each branch; an amplification stage coupled to the common output of the first attenuation stage to provide a multiplexed output; and a second attenuation stage configured to receive the multiplexed output of the amplification stage to provide an amplified output signal to maintain various desired characteristics across a range of gain levels; and a controller implemented to control the variable gain signal amplifier to provide a plurality of gain modes such that, in a high gain mode, the variable gain signal amplifier directs signals along a path that bypasses the variable-attenuation element in a particular branch by controlling the switch circuit in the particular branch to be in the first state.

19. The device of claim 18 wherein, in the high gain mode, a noise factor of a signal is not increased due at least in part to bypassing the variable-attenuation element.

20. The device of claim 19 wherein, in other gain modes, IIP3 of the signal is increased due at least in part to tailored attenuation provided by the variable-attenuation element.

* * * * *